(12) United States Patent
Kimura et al.

(10) Patent No.: US 10,373,581 B2
(45) Date of Patent: Aug. 6, 2019

(54) SEMICONDUCTOR DEVICE, AND DISPLAY DEVICE AND ELECTRONIC DEVICE UTILIZING THE SAME

(71) Applicant: Semiconductor Energy Laboratory Co., Ltd., Atsugi-shi, Kanagawa-ken (JP)

(72) Inventors: Hajime Kimura, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/178,650

(22) Filed: Nov. 2, 2018

(65) Prior Publication Data

US 2019/0180711 A1 Jun. 13, 2019

Related U.S. Application Data

(63) Continuation of application No. 15/880,590, filed on Jan. 26, 2018, now Pat. No. 10,121,448, which is a (Continued)

(30) Foreign Application Priority Data

Dec. 25, 2002 (JP) .................................. 2002-374098

(51) Int. Cl.
*G09G 5/00* (2006.01)
*H01L 27/12* (2006.01)
(Continued)

(52) U.S. Cl.
CPC ............... *G09G 5/003* (2013.01); *G09G 3/36* (2013.01); *H01L 27/124* (2013.01); (Continued)

(58) Field of Classification Search
CPC .. G09G 3/36; G09G 5/003; G09G 2310/0267; G09G 2310/0275;
(Continued)

(56) References Cited

U.S. PATENT DOCUMENTS 3,506,851 A 4/1970 Polkinghorn et al.
3,774,055 A 11/1973 Bapat
(Continued)

FOREIGN PATENT DOCUMENTS

EP 0103645 A 3/1984
EP 0220953 A 5/1987
(Continued)

OTHER PUBLICATIONS

Jeon.J et al., "3.2: Integrated a-Si Gate Driver Circuit for TFT-LCD Panel", SID Digest '04 : SID International Symposium Digest of Technical Papers, 2004, vol. 35, pp. 10-13.
(Continued)

*Primary Examiner* — Vijay Shankar
(74) *Attorney, Agent, or Firm* — Fish & Richardson P.C.

(57) ABSTRACT

A semiconductor device having a normal function means is provided, in which the amplitude of an output signal is prevented from being decreased even when a digital circuit using transistors having one conductivity is employed. By turning OFF a diode-connected transistor 101, the gate terminal of a first transistor 102 is brought into a floating state. At this time, the first transistor 102 is ON and its gate-source voltage is stored in a capacitor. Then, when a potential at the source terminal of the first transistor 102 is increased, a potential at the gate terminal of the first transistor 102 is increased as well by bootstrap effect. As a result, the amplitude of an output signal is prevented from being decreased.

10 Claims, 29 Drawing Sheets

Related U.S. Application Data continuation of application No. 15/582,886, filed on May 1, 2017, now Pat. No. 9,881,582, which is a continuation of application No. 14/941,739, filed on Nov. 16, 2015, now Pat. No. 9,640,135, which is a continuation of application No. 14/472,748, filed on Aug. 29, 2014, now Pat. No. 9,190,425, which is a continuation of application No. 13/906,934, filed on May 31, 2013, now Pat. No. 8,823,620, which is a continuation of application No. 13/277,301, filed on Oct. 20, 2011, now Pat. No. 8,456,402, which is a continuation of application No. 12/849,885, filed on Aug. 4, 2010, now Pat. No. 8,044,906, which is a continuation of application No. 11/675,122, filed on Feb. 15, 2007, now Pat. No. 7,786,985, which is a continuation of application No. 10/740,840, filed on Dec. 22, 2003, now Pat. No. 7,202,863.

(51) Int. Cl.
*H03K 19/0185* (2006.01)
*G09G 3/36* (2006.01)

(52) U.S. Cl.
CPC . *H01L 27/1255* (2013.01); *H03K 19/018507* (2013.01); *G09G 2310/0267* (2013.01); *G09G 2310/0275* (2013.01); *G09G 2310/0286* (2013.01); *G09G 2310/0289* (2013.01); *G09G 2330/021* (2013.01)

(58) Field of Classification Search
CPC ..... G09G 2330/021; G09G 2310/0286; G09G 2310/0289
See application file for complete search history.

(56) References Cited

U.S. PATENT DOCUMENTS

| | | |
|---|---|---|
| 3,898,479 A | 8/1975 | Proebsting |
| 4,090,096 A | 5/1978 | Nagami |
| 4,275,313 A | 6/1981 | Boll et al. |
| 4,390,803 A | 6/1983 | Koike |
| 4,412,139 A | 10/1983 | Horninger |
| 4,578,597 A | 3/1986 | Soneda et al. |
| 4,633,105 A | 12/1986 | Tsujimoto |
| 4,746,824 A | 5/1988 | Magome et al. |
| 4,804,870 A | 2/1989 | Mahmud |
| 4,959,697 A | 9/1990 | Shier et al. |
| 5,170,155 A | 12/1992 | Plus et al. |
| 5,434,899 A | 7/1995 | Huq et al. |
| 5,467,038 A | 11/1995 | Motley et al. |
| 5,514,994 A | 5/1996 | Sawada |
| 5,548,143 A | 8/1996 | Lee |
| 5,604,704 A | 2/1997 | Atsumo |
| 5,643,826 A | 7/1997 | Ohtani et al. |
| 5,694,061 A | 12/1997 | Morosawa et al. |
| 5,870,071 A | 2/1999 | Kawahata |
| 5,889,291 A | 3/1999 | Koyama et al. |
| 5,949,271 A | 9/1999 | Fujikura |
| 5,949,398 A | 9/1999 | Kim |
| 5,952,991 A | 9/1999 | Akiyama |
| 6,040,810 A | 3/2000 | Nishimura |
| 6,049,228 A | 4/2000 | Moon |
| 6,064,713 A | 5/2000 | Lebrun et al. |
| 6,091,393 A | 7/2000 | Park |
| 6,295,046 B1 | 9/2001 | Hebiguchi |
| 6,384,804 B1 | 5/2002 | Dodabalapur et al. |
| 6,392,625 B1 | 5/2002 | Sato et al. |
| 6,426,743 B1 | 7/2002 | Yeo et al. |
| 6,501,098 B2 | 12/2002 | Yamazaki |
| 6,522,323 B1 | 2/2003 | Sasaki et al. |
| 6,542,138 B1 | 4/2003 | Shannon et al. |
| 6,556,646 B1 | 4/2003 | Yeo et al. |
| 6,621,886 B2 | 9/2003 | Kawahata |
| 6,674,245 B2 | 1/2004 | Ko et al. |
| 6,686,899 B2 | 2/2004 | Miyazawa et al. |
| 6,690,347 B2 | 2/2004 | Jeon et al. |
| 6,753,654 B2 | 6/2004 | Koyama |
| 6,774,419 B2 | 8/2004 | Kimura |
| 6,845,140 B2 | 1/2005 | Moon et al. |
| 6,891,356 B2 | 5/2005 | Kimura et al. |
| 6,928,135 B2 | 8/2005 | Sasaki et al. |
| 6,928,136 B2 | 8/2005 | Nagao et al. |
| 7,046,240 B2 | 5/2006 | Kimura |
| 7,098,882 B2 | 8/2006 | Kitani et al. |
| 7,115,902 B1 | 10/2006 | Yamazaki |
| 7,151,278 B2 | 12/2006 | Nagao et al. |
| 7,202,863 B2 | 4/2007 | Kimura et al. |
| 7,203,264 B2 | 4/2007 | Lo et al. |
| 7,289,096 B2 | 10/2007 | Jeon et al. |
| 7,365,713 B2 | 4/2008 | Kimura |
| 7,382,347 B2 | 6/2008 | Sasaki et al. |
| 7,394,102 B2 | 7/2008 | Nagao et al. |
| 7,456,810 B2 | 11/2008 | Kimura |
| 7,460,099 B2 | 12/2008 | Kubota et al. |
| 7,586,478 B2 | 9/2009 | Azami et al. |
| 7,629,612 B2 | 12/2009 | Kimura |
| 7,696,974 B2 | 4/2010 | Moon et al. |
| 7,738,014 B2 | 6/2010 | Kwak et al. |
| 7,786,985 B2 | 8/2010 | Kimura et al. |
| 8,044,906 B2 | 10/2011 | Kimura et al. |
| 8,059,078 B2 | 11/2011 | Kimura et al. |
| 8,212,257 B2 | 7/2012 | Kimura |
| 8,456,402 B2 | 6/2013 | Kimura et al. |
| 8,586,991 B2 | 11/2013 | Kimura |
| 8,823,620 B2 | 9/2014 | Kimura et al. |
| 9,190,425 B2 | 11/2015 | Kimura et al. |
| 9,640,135 B2 | 5/2017 | Kimura et al. |
| 9,881,582 B2 | 1/2018 | Kimura et al. |
| 10,121,448 B2 * | 11/2018 | Kimura .......... H03K 19/018507 |
| 2001/0002703 A1 | 6/2001 | Koyama |
| 2001/0024186 A1 | 9/2001 | Kane et al. |
| 2001/0045565 A1 | 11/2001 | Yamazaki |
| 2001/0054999 A1 | 12/2001 | Azami |
| 2002/0011973 A1 | 1/2002 | Komiya |
| 2002/0044208 A1 | 4/2002 | Yamazaki et al. |
| 2002/0097212 A1 | 7/2002 | Miyazawa et al. |
| 2002/0118159 A1 | 8/2002 | Azami |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2002/0196212 A1 | 12/2002 | Nishitoba et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0052854 A1 | 3/2003 | Juang |
| 2003/0103022 A1 | 6/2003 | Noguchi et al. |
| 2003/0111677 A1 | 6/2003 | Miyake |
| 2003/0128200 A1 | 7/2003 | Yumoto |
| 2003/0179166 A1 | 9/2003 | Li |
| 2003/0214465 A1 | 11/2003 | Kimura |
| 2003/0231152 A1 | 12/2003 | Shin |
| 2004/0080474 A1 | 4/2004 | Kimura |
| 2004/0239600 A1 | 12/2004 | Lin |
| 2004/0239608 A1 | 12/2004 | Chung |
| 2005/0057556 A1 | 3/2005 | Kubota et al. |
| 2005/0156858 A1 | 7/2005 | Ahn et al. |
| 2005/0162354 A1 | 7/2005 | Osame et al. |
| 2006/0007216 A1 | 1/2006 | Sato et al. |
| 2006/0077198 A1 | 4/2006 | Okumura et al. |
| 2006/0256046 A1 | 11/2006 | Kimura |
| 2007/0242018 A1 | 10/2007 | Park |

FOREIGN PATENT DOCUMENTS

| | | |
|---|---|---|
| EP | 1063630 A | 12/2000 |
| EP | 1139326 A | 10/2001 |
| EP | 1231594 A | 8/2002 |
| JP | 55-156427 A | 12/1980 |
| JP | 58-151719 A | 9/1983 |
| JP | 59-016424 A | 1/1984 |
| JP | 60-030217 A | 2/1985 |

(56) References Cited

FOREIGN PATENT DOCUMENTS

| | | |
|---|---|---|
| JP | 60-140924 A | 7/1985 |
| JP | 62-098915 A | 5/1987 |
| JP | 63-204815 A | 8/1988 |
| JP | 64-039118 A | 2/1989 |
| JP | 03-165171 A | 7/1991 |
| JP | 04-192920 A | 7/1992 |
| JP | 05-048420 A | 2/1993 |
| JP | 05-182469 A | 7/1993 |
| JP | 05-243946 A | 9/1993 |
| JP | 05-303354 A | 11/1993 |
| JP | 06-098081 A | 4/1994 |
| JP | 06-350433 A | 12/1994 |
| JP | 08-050790 A | 2/1996 |
| JP | 08-083486 A | 3/1996 |
| JP | 09-033887 A | 2/1997 |
| JP | 09-080382 A | 3/1997 |
| JP | 09-186312 A | 7/1997 |
| JP | 09-246936 A | 9/1997 |
| JP | 10-301087 A | 11/1998 |
| JP | 11-502355 | 2/1999 |
| JP | 11-086586 A | 3/1999 |
| JP | 2000-029436 A | 1/2000 |
| JP | 2000-106617 A | 4/2000 |
| JP | 2000-112444 A | 4/2000 |
| JP | 2000-155550 A | 6/2000 |
| JP | 3092506 | 7/2000 |
| JP | 2001-005426 A | 1/2001 |
| JP | 2001-075542 A | 3/2001 |
| JP | 2001-109394 A | 4/2001 |
| JP | 2001-133431 A | 5/2001 |
| JP | 2001-134238 A | 5/2001 |
| JP | 2001-325798 A | 11/2001 |
| JP | 2002-133890 A | 5/2002 |
| JP | 2002-176162 A | 6/2002 |
| JP | 2002-197885 A | 7/2002 |
| JP | 3330746 | 7/2002 |
| JP | 2002-251164 A | 9/2002 |
| JP | 2002-258819 A | 9/2002 |
| JP | 2002-313093 A | 10/2002 |
| JP | 2002-328643 A | 11/2002 |
| JP | 2003-216126 A | 7/2003 |
| JP | 2016-106448 A | 6/2016 |
| WO | WO-2002/065062 | 8/2002 |

OTHER PUBLICATIONS

Stewart.R et al., "8.4: Circuit Design for a-Si AMLCDs with Integrated Drivers", SID Digest '95 : SID International Symposium Digest of Technical Papers, 1995, vol. 26, pp. 89-92.

Oh.J et al., "15.2: 2.0 Inch A-Si:H TFT-LCD With Low Noise Integrated Gate Driver", SID Digest '05 : SID International Symposium Digest of Technical Papers, May 24, 2005, vol. 36, pp. 942-945.

Maurice.F et al., "High Resolution Projection Valve With the Amorphous Silicon AMLCD Technology", Proceedings of SPIE—Conference on Projection Displays IV, 1998, vol. 3296, pp. 92-99.

\* cited by examiner

SEMICONDUCTOR DEVICE, AND DISPLAY DEVICE AND ELECTRONIC DEVICE UTILIZING THE SAME

CROSS-REFERENCE TO RELATED APPLICATIONS

This application is a continuation of U.S. application Ser. No. 15/880,590, filed Jan. 26, 2018, now allowed; which is a continuation of U.S. application Ser. No. 15/582,886, filed May 1, 2017, now U.S. Pat. No. 9,881,582; which is a continuation of U.S. application Ser. No. 14/941,739, filed Nov. 16, 2015, now U.S. Pat. No. 9,640,135; which is a continuation of U.S. application Ser. No. 14/472,748, filed Aug. 29, 2014, now U.S. Pat. No. 9,190,425; which is a continuation of U.S. application Ser. No. 13/906,934, filed May 31, 2013, now U.S. Pat. No. 8,823,620, which is a continuation of U.S. application Ser. No. 13/277,301, filed Oct. 20, 2011, now U.S. Pat. No. 8,456,402; which is a continuation of U.S. application Ser. No. 12/849,885, filed Aug. 4, 2010, now U.S. Pat. No. 8,044,906; which is a continuation of U.S. application Ser. No. 11/675,122, filed Feb. 15, 2007, now U.S. Pat. No. 7,786,985; which is a continuation of U.S. application Ser. No. 10/740,840, filed Dec. 22, 2003, now U.S. Pat. No. 7,202,863; which claims the benefit of a foreign priority application filed in Japan as Serial No. 2002-374098 on Dec. 25, 2002, all of which are incorporated by reference.

INDUSTRIAL FIELD FOR THE INVENTION

The present invention relates to a configuration of a digital circuit. More particularly, the invention relates to a technology for amplifying an output signal even larger by using a bootstrap circuit, and further to a display device, a semiconductor device or an electronic device each using the technology.

BACKGROUND ART

In recent years, display devices in which a semiconductor thin film is formed on an insulator such as a glass substrate, in particular active matrix display devices using thin film transistors (hereinafter referred to as TFTs), have been in widespread use in various fields. An active matrix display device using TFTs has several hundred thousand to several million pixels arranged in matrix, and it displays images by controlling the electric charge in each pixel by using a TFT disposed in each pixel.

As a recent technology, the technology relating to polysilicon TFTs in which a driver circuit is simultaneously formed in a peripheral region of a pixel portion in addition to TFTs which constitute pixels, has been developed. This technology contributes greatly to reducing devices in size and electric power consumption. Display devices have thus become indispensable devices to be used for display portions of mobile information terminals and the like, application fields of which are expanding at remarkable speed.

As the driver circuit of the display device, a CMOS circuit in which an N-channel TFT and a P-channel TFT are combined is usually adopted. The CMOS circuit has advantages in that, it can suppress the consumed current in the whole circuit and perform high speed driving since a current flows only at an instant when logic is changed and a current does not flow during a period in which a certain logic is held (as there is only a minute leak current in practice).

As mobile electronic devices are reduced in size and weight, demand for a display device using a self-light emitting element and a liquid crystal element and the like such as an organic EL element, an FED (Field Emission Display), and an element used for a liquid crystal display is rapidly increasing; however, from the viewpoint of the yield and the like, it is difficult to reduce the manufacturing cost to the level sufficiently low since the great many number of TFTs are required. It is easily supposed that the demand is further rapidly increased in future, and therefore, it is desired that the display device can be supplied more inexpensively.

As a method of fabricating a driver circuit on an insulator, there is a common method in which patterns of active layers, wirings and the like are formed through exposure treatment and etching with a plurality of photomasks. Since the number of manufacturing steps is a dominant factor in determining the manufacturing cost, a manufacturing method using as small number of manufacturing steps as possible is ideal for manufacturing driver circuits. Thereupon, a driver circuit, which is conventionally configured by the CMOS circuit, is configured by using TFTs which have either N-channel type or P-channel type conductivity. With this method, a part of an ion doping step can be omitted, and the number of the photomasks can also be reduced. Therefore, the cost reduction is achieved.

FIG. 9A shows an example of a TFT load-type inverter circuit formed by using TFTs having only one conductivity. The operation thereof is described below.

FIG. 9B shows the waveform of a signal input to the inverter circuit. The input signal amplitude is between a high potential side power supply VDD and a low potential side power supply GND. It is assumed that GND=0 V for simplicity.

The circuit operation is described now. To describe the operation simply and explicitly, the threshold voltages of N-channel type TFT which configure the circuit have no variations and represented by (VthN) across the board, and the threshold voltages of P-channel type TFTs are similarly represented by a constant value (VthP).

When a signal as shown in FIG. 9B is input to the inverter circuit and the input signal is an L signal (low potential side power supply GND), an N-channel type TFT 904 is turned OFF. Meanwhile, a potential at an output terminal is pulled up toward a high potential side power supply VDD since a load TFT 903 operates in a saturated region at all times. On the other hand, when the input signal is an H signal (high potential side power supply VDD), the N-channel type TFT 904 is turned ON. The potential at the output node is pulled down toward the low potential side power supply GND if the current capacity of the n-channel type TFT 904 is set sufficiently larger than that of the load TFT 903.

However, there is the following problem in this case. FIG. 9C shows the waveform of the output from the TFT load-type inverter circuit. When the input signal is at L level, the potential at the output terminal is lower than VDD by an amount denoted by 907, namely by a threshold voltage of the load TFT 903 as shown in FIG. 9C. This is because few current flows in the load TFT 903 when the gate-source voltage of the load TFT 903 is smaller than the threshold voltage, thus the load TFT 903 is turned OFF. The source terminal of the load TFT 903 is an output terminal and the gate terminal thereof is connected to VDD here. Therefore, the potential at the output terminal is lower than the potential at the gate terminal by the threshold voltage. That is, the potential at the output terminal can be increased to be (VDD−VthN) at highest. Further, when the input signal is an H signal, the potential at the output terminal is higher than GND by an amount denoted by 908, depending on the ratio of the current capacities of the load TFT 903 to the n-channel type TFT 904. To bring the output potential sufficiently close to GND, it is necessary to sufficiently increase the current capacity of the n-channel type TFT 904 relatively to that of the load TFT 903.

That is, when using the above-described inverter circuit formed by using TFTs having only one conductivity, the amplitude of the output signal is attenuated relative to the amplitude of the input signal.

Hereupon, several methods for avoiding the problem that the amplitude of an output signal is attenuated have been studied (see Patent Documents 1 to 4 for example).

FIG. 33 shows a circuit diagram of an inverter circuit shown in Patent Documents 1 and 2. The circuit shown in FIG. 33 has the advantage that when the gate terminal of a transistor 3302 is brought into a floating state, a voltage at both terminals (potential difference between both terminals) of a capacitor 3304 does not change.

The operation of FIG. 33 is described next. A pair of signals inverted from each other is input to each of input terminals 3305 and 3306. First, an H signal (high potential side power supply VDD) is input to the input terminal 3306 and an L signal (low potential side power supply GND) is input to the input terminal 3305. Then, a transistor 3303 is turned ON and a potential at a terminal 3308 becomes equal to the potential of the L signal (low potential side power supply GND). Meanwhile, a transistor 3301 is turned ON as the potential at the input terminal 3305 is equal to the potential of the L signal (low potential side power supply GND). As a result, a terminal 3307 becomes equal to the potential of the L signal (low potential side power supply GND). That is, the voltage at both terminals (potential difference between both terminals) of the capacitor 3304 becomes equal to 0 V.

Next, when an H signal (high potential side power supply VDD) is input to the input terminal 3305 and an L signal (low potential side power supply GND) is input to the input terminal 3306, the transistor 3303 is turned OFF. Since the potential at the input terminal 3305 is equal to the potential of the H signal (high potential side power supply VDD), the transistor 3301 is turned ON and thus the potential at the terminal 3307 is increased. When the gate-source voltage of the transistor 3302 becomes higher than the threshold voltage, the transistor 3302 is turned ON and a potential at the terminal 3308 starts increasing. In such a case, when the potential at the terminal 3307 keeps on increasing, the transistor 3301 is turned OFF at the end. This is because, as the terminal 3307 corresponds to the source terminal of the transistor 3301, the gate-source voltage of the transistor 3301 becomes smaller when the potential at the terminal 3307 is increased, thus reaches the threshold voltage at the end. When the gate-source voltage of the transistor 3301 becomes equal to the threshold voltage, the transistor 3301 is turned OFF. Therefore, the current flow from the terminal 3305 to the terminal 3307 is cut off. That is, the terminal 3307 is brought into a floating state. As a result, the voltage at both terminals (potential difference between both terminals) of the capacitor 3304 does not change any more.

In the case where the potential at the terminal 3308 still keeps on increasing at the point when the transistor 3301 is turned OFF, the transistor 3302 is ON. That is, the gate-source voltage of the transistor 3302, namely the voltage at both terminals (potential difference between both terminals) of the capacitor 3304 is larger than the threshold voltage of the transistor 3302. Therefore, the potential at the terminal 3308 is further increased. At this time, the potential at the terminal 3307 is also increased. This is because, when the potential at either terminal of the capacitor 3304 (the terminal 3308) is increased, the potential at the other terminal (the terminal 3307) is also increased since the voltage at both terminals (potential difference between both terminals) of the capacitor 3304 does not change any more. Thus, the potential at the terminal 3308 keeps on increasing and reaches the high potential side power supply VDD at the end. While the potential at the terminal 3308 is increasing until it reaches the high potential side power supply VDD, the transistor 3302 is constantly ON. The capacitor 3304 holds the very voltage at which the transistor 3301 is turned OFF. Therefore, the potential at the terminal 3307 is higher than the high potential side power supply VDD by the voltage which is stored in the capacitor 3304.

That is, the potentials at the terminals 3307 and 3308 are equal to or higher than the high potential side power supply VDD. Thus, it can be prevented that the amplitude of the output signal becomes smaller than that of the input signal.

Such a circuit is generally referred to as a bootstrap circuit.

[Patent Document 1] Japanese Patent Laid-Open No. Hei 8-50790

[Patent Document 2] Japanese Patent No. 3330746 Specification

[Patent Document 3] Japanese Patent No. 3092506 Specification

[Patent Document 4] Japanese Patent Laid-Open No. 2002-328643

DISCLOSURE OF THE INVENTION

Problems to be Solved by the Invention

However, there are two major problems in the inverter circuit shown in FIG. 33.

The first problem is that when an H signal (high potential side power supply VDD) is input to the input terminal 3305 and an L signal (low potential side power supply GND) is input to the input terminal 3306, the potentials at the terminals 3307 and 3308 are not increased sufficiently in the case where the transistor 3301 is turned OFF late. If the transistor 3302 is turned OFF first, the capacitor 3304 accumulates the threshold voltage of the transistor 3302 as it is disposed between the gate and the source of the transistor 3302. At this time, the potential at the terminal 3307 is still on the increase since the transistor 3301 is ON. When the transistor 3301 is turned OFF, the threshold voltage of the transistor 3302 is held in the capacitor, and the transistor 3302 is turned OFF. Thus, the potentials at the terminals 3308 and 3307 do not increase any more.

The second problem is that when the potential of an H signal input to the input terminal 3305 is lower than the high potential side power supply VDD, the potentials at the terminals 3307 and 3308 are not increased sufficiently. In the case of employing the circuit as shown in FIG. 9A as the circuit for outputting a signal to the input terminal 3305, the potential of the H signal may be lower than the high potential side power supply VDD. Hereupon, suppose the case where the difference between the potential of the H signal and the high potential side power supply VDD is higher than the threshold voltage of the transistor 3301. In such a case, the transistor 3301 is not turned OFF even if the potential increase at the terminal 3307 terminates when the H signal is input to the input terminal 3305 and the L signal (low potential side power supply GND) is input to the input terminal 3306. That is, the terminal 3307 is not brought into a floating state, and the electric charge is kept on being supplied from the terminal 3305 to the terminal 3307. Therefore, the potentials at the terminals 3305 and 3307 are maintained to be equal to each other. Thus, operation such as the one in which the voltage at both terminals (potential difference between both terminals) of the capacitor 3304 does not change is not brought on. As a result, the potentials at the terminals 3307 and 3308 are not increased sufficiently.

When connecting the output terminal of the inverter circuit as described above to another inverter circuit of the similar configuration, the signal amplitude of the output terminal becomes even lower. That is, as the larger number of circuits is connected to the output terminal of the inverter circuit, the amplitude of the output signal becomes smaller. Thus the normal circuit operation is not achieved.

On the other hand, according to the inverter circuit shown in Patent Document 4, the aforementioned second problem is solved. FIG. 34 shows an inverter circuit shown in Patent Document 4. When an H signal which is lower than the high potential side power supply VDD is input to an input terminal 3405, and an L signal (low potential side power supply GND) is input to an input terminal 3406, a potential at a terminal 3407 is increased. When the gate-source voltage of a transistor 3401 becomes equal to the threshold voltage, the transistor 3401 is turned OFF. That is, the terminal 3407 is brought into a floating state. Thus, a voltage at both terminals (potential difference between both terminals) of a capacitor 3404 at this time is stored. Therefore, if a transistor 3402 is ON at the point when the transistor 3401 is turned OFF, a potential at a terminal 3408 keeps on increasing, and the potential at the terminal 3407 is also increased as a result.

However, the first problem mentioned above is not solved even when using the circuit shown in FIG. 34.

In view of the foregoing problem, it is an object of the invention to provide a semiconductor device in which the amplitude of an output signal does not easily become smaller. It is another object of the invention to provide a semiconductor device in which a circuit can be configured by using transistors having only one conductivity.

It is to be noted that a semiconductor device means a device which includes a circuit having a semiconductor element (transistor and diode), a capacitor, a resistor and the like. It is needless to mention that the invention is not limited to these elements.

Means for Solving the Problem

The present invention uses the following means to solve the aforementioned problems.

A semiconductor device according to the invention includes first to third transistors and first and second input terminals, wherein the source terminal of the first transistor is connected to the drain terminal of the second transistor, the drain terminal of the third transistor is connected to the gate terminal of the first transistor, the first input terminal is connected to the gate terminal of the third transistor and the gate terminal of the second transistor, and the second input terminal is connected to the gate terminal of the first transistor through a rectifying element.

In addition, according to the above configuration of the semiconductor device of the invention, the rectifying element is a diode-connected transistor.

That is, according to the invention, the rectifying element such as a diode-connected transistor is connected to a signal input portion.

By turning OFF the diode-connected transistor, the gate terminal of the first transistor is brought into a floating state. At this time, the first transistor is ON, and its gate-source voltage is stored in a capacitor (gate capacitance of the transistor). Subsequently, when a potential at the source terminal of the first transistor is increased, a potential at the gate terminal of the first transistor is increased as well due to bootstrap effect. As a result, the amplitude of an output signal is prevented from being decreased.

In addition, according to the above configuration of the semiconductor device of the invention, the third transistor is connected in series to a second rectifying element.

In addition, according to the above configuration of the semiconductor device of the invention, the second rectifying element is a diode-connected transistor.

That is, the second rectifying element such as a diode-connected transistor is connected to the gate terminal portion of the first transistor.

By turning OFF the diode-connected transistor as the second rectifying element, a potential at the gate terminal of the first transistor is prevented from dropping to a large degree. As a result, the amplitude of an output signal is prevented from being decreased.

In addition, according to the above configuration of the semiconductor device of the invention, the diode-connected transistor and the first transistor have the same conductivity.

That is, by adopting transistors having the same conductivity for both the first transistor and the diode-connected transistor, all the transistors configuring the circuit can have the same conductivity. As a result, cost reduction can be achieved.

In addition, according to the above configuration of the semiconductor device of the invention, the diode-connected transistor as the second rectifying element and the first transistor have the same conductivity.

That is, by adopting transistors having the same conductivity for both the first transistor and the diode-connected transistor as the second rectifying element, the threshold voltage of each transistor can be set roughly the same. Since the threshold voltage of the first transistor is almost equal to that of the diode-connected transistor as the second rectifying element, it is prevented that current leaks when the first transistor is required to be turned OFF.

In addition, according to the above configuration of the semiconductor device of the invention, a capacitor is provided, one of which is connected to the gate terminal of the first transistor and the other terminal thereof is connected to the source terminal of the first transistor.

It is to be noted that the transistor of the invention may be formed by any types of material, means and manufacturing method, and any types of transistor can be employed. For example, it may be, a thin film transistor (TFT). Among TFTs, a TFT having an amorphous, poly crystalline or single crystalline semiconductor layer may be adopted. As an alternative transistor, a transistor formed on a single crystalline substrate, an SOI substrate, a plastic substrate or a glass substrate may be adopted. Further, a transistor formed of an organic material or a carbon nanotube may be adopted as well. A MOS type transistor or a bipolar transistor may also be employed.

It is to be noted that according to the invention, connection means an electrical connection. Therefore, other elements or circuits and the like may be interposed between the shown elements.

According to the configuration of the invention, either terminal of a capacitor configuring a bootstrap circuit is easily brought into a floating state. As a result, the amplitude of an output signal is prevented from being decreased. In addition, even when the amplitude of an input signal is small, either terminal of the capacitor configuring the bootstrap circuit can be brought into a floating state. Therefore, the amplitude of an output signal is prevented from being decreased. Further, as the circuit can be configured by using transistors of only one conductivity, the manufacturing cost can be reduced.

EMBODIMENT MODES OF THE INVENTION

The circuit configuration of a semiconductor device of the invention will be hereinafter described.

Embodiment Mode 1

First, described in this embodiment mode is an inverter circuit for dealing with the second problem as described in the section of the problems to be solved by the invention. That is, described here is the inverter circuit for dealing with the problem that a potential at a certain terminal are not increased sufficiently in the case where a potential of an H signal which is input to an input terminal is lower than a high potential side power supply VDD.

Figure 2:
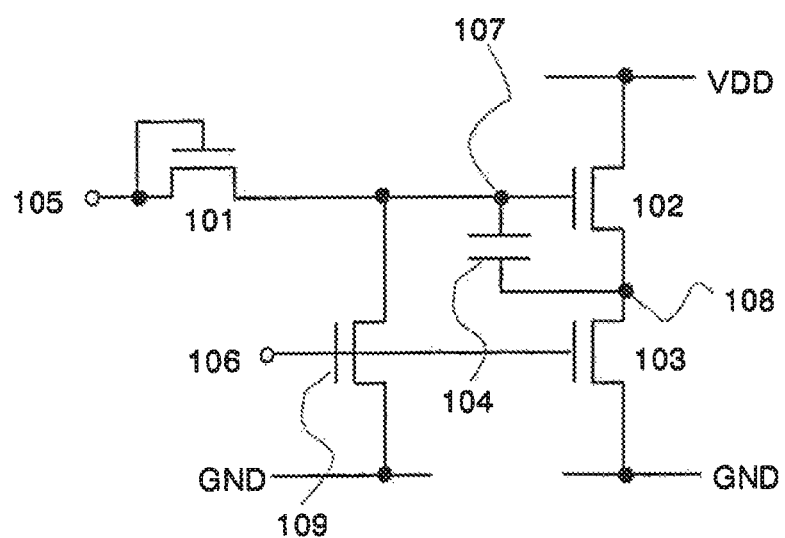
FIG. 2 is a diagram showing the configuration of a circuit in the case of applying the invention to an inverter circuit.

FIG. 2 shows an inverter circuit in which potentials at terminals 107 and 108 can be increased sufficiently even when a potential of an H signal which is input to an input terminal 105 is lower than a high potential side power supply VDD. The input terminal 105 is connected to the gate terminal of a transistor 102 through a diode-connected transistor 101. Since the transistor 101 is diode connected, its gate terminal is connected to the input terminal 105. Therefore, current can flow in the direction from the terminal 105 to the terminal 107 while not in the direction from the terminal 107 to the terminal 105. In addition, a capacitor 104 is connected between the gate terminal and the source terminal of the transistor 102. The drain terminal of a transistor 103 is connected to the source terminal of the transistor 102, and the gate terminal of the transistor 103 is connected to an input terminal 106. The gate terminal of a transistor 109 is connected to the input terminal 106, and the drain terminal thereof is connected to the gate terminal of the transistor 102.

It is to be noted that although the source terminal of the transistor 109 and the source terminal of the transistor 103 are connected to a low potential side power supply GND, the invention is not limited to this. Each source terminal may be connected to a wiring of a different potential, or a pulse signal may be input to the terminal.

Also, although the input terminal 106 is connected to the gate terminal of the transistor 109 and the gate terminal of the transistor 103, the invention is not limited to this. Each gate terminal may be connected to a different input terminal.

In addition, although the drain terminal of the transistor 102 is connected to the high potential side power supply VDD, the invention is not limited to this. It may be connected to a wiring of a different potential or a pulse signal may be input to it.

The operation of FIG. 2 is described now. A pair of signals inverted from each other is input to each of the input terminals 105 and 106. However, it is also possible to operate the circuit without inputting an inverted signal at all times. First, an H signal (high potential side power supply VDD) is input to the input terminal 106, and an L signal (low potential side power supply GND) is input to the input terminal 105. Then, the transistors 109 and 103 are turned ON. As a result, a potential at the terminal 108 becomes equal to GND. Since a potential at the terminal 107 becomes equal to GND, the transistor 102 is turned OFF. In addition, since the terminals 105 and 107 have the same potential, the transistor 101 is turned OFF. Also, a voltage at both terminals (potential difference between both terminals) of the capacitor 104 becomes equal to 0 V.

Next, an H signal (high potential side power supply VDD) is input to the input terminal 105 and an L signal (low potential side power supply GND) is input to the input terminal 106. Then, the transistors 109 and 103 are turned OFF. Since a potential at the input terminal 105 is equal to the potential of the H signal (high potential side power supply VDD), the transistor 101 is turned ON and the potential at the terminal 107 is increased. When the gate-source voltage of the transistor 102 becomes larger than the threshold voltage, the transistor 102 is turned ON and the potential at the terminal 108 starts increasing. In such a case, as the potential at the terminal 107 keeps on increasing, the transistor 101 is turned OFF at the end. This is because, since the terminal 107 corresponds to the source terminal of the transistor 101, the gate-source voltage (drain-source voltage) of the transistor 101 drops when the potential at the terminal 107 is increased, thus it reaches the threshold voltage at the end. When the gate-source voltage of the transistor 101 becomes equal to the threshold voltage, the transistor 101 is turned OFF. Therefore, the current flow from the terminal 105 to the terminal 107 is cut off. That is, the terminal 107 is brought into a floating state. As a result, the voltage at both terminals (potential difference between both terminals) of the capacitor 104 does not change anymore.

If the potential at the terminal 108 is still on the increase at the point when the transistor 101 is turned OFF, the transistor 102 is ON. That is, the gate-source voltage of the transistor 102, namely the voltage at both terminals (potential difference between both terminals) of the capacitor 104 is larger than the threshold voltage of the transistor 102. Thus, the potential at the terminal 108 further keeps on increasing. At this time, the potential at the terminal 107 is increased as well. This is because, since the voltage at both terminals (potential difference between both terminals) of the capacitor 104 does not change anymore, when a potential at either terminal (the terminal 108) of the capacitor 104 is increased, the other terminal thereof (the terminal 107) is also increased. The potential at the terminal 108 further keeps on increasing, and it reaches the high potential side power supply VDD at the end. Until the potential at the terminal 108 reaches the high potential side power supply VDD, the transistor 102 is constantly ON. The capacitor 104 stores the very voltage at the point when the transistor 101 is turned OFF. Therefore, the potential at the terminal 107 is higher than the high potential side power supply VDD by the voltage which is stored in the capacitor 3304.

That is, each of the potentials at the terminals 107 and 108 is equal to or more than the high potential side power supply VDD. Therefore, a problem such that the amplitude of an output signal becomes smaller than that of an input signal can be prevented.

As described above, the signal which is input to the terminal 106 is inverted in the terminals 107 and 108. Thus, in the inverter circuit shown in FIG. 2, the input terminal corresponds to the terminal 106, and the output terminal corresponds to the terminal 107 or 108. The terminal 105 may be input with an inverted signal of the signal at the terminal 106. Therefore, the terminal 105 may be included in the input terminals.

Whether to output a signal to the terminal 107 or to the terminal 108 may be determined by the size of input impedance of a circuit which is connected next to the inverter circuit. That is, the terminal 107 is required to be in a floating state depending on the operating condition. Therefore, the terminal 107 cannot be connected to a circuit having low input impedance. However, the potential at the terminal 107 can be set higher than VDD when an H signal is input to it. Meanwhile, the terminal 108 can be connected to a circuit of which input impedance is not low since the terminal 108 does not need to be in a floating state. However, when an H signal is input to the terminal 108, the potential at the terminal 108 does not become higher than VDD. As described above, since each terminal has differences, whether to output a signal to the terminal 107, or the terminal 108 may be determined appropriately.

Figure 3:
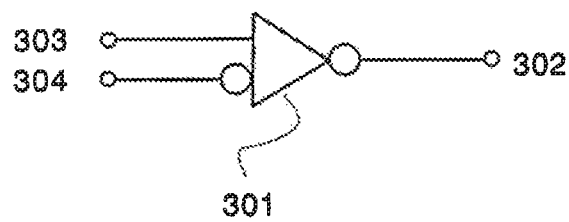
FIG. 3 is a diagram showing a symbol expressing an inverter circuit to which the invention is applied.

FIG. 3 shows a symbol 301 representing the inverter circuit shown in FIG. 2. An input terminal 303 corresponds to the terminal 106 and an input terminal 304 corresponds to the terminal 105. An output terminal 302 corresponds to the terminal 108 or the terminal 107. A pair of signals inverted from each other is input to each of the terminal 303 and the terminal 304. Taking account of its operation as an inverter circuit, a signal which is input to the terminal 303 is inverted and output to the output terminal 302. Thus, the terminal 303 corresponds to the input terminal in an inverter circuit.

Described herein is the case where the potential of an H signal which is input to the input terminal 105 is lower than the high potential side power supply VDD. Suppose the case in which the difference between the potential of an H signal which is input to the input terminal 105 and the high potential side power supply VDD is higher than the threshold voltage of the transistor 101. Even in such a case, when an H signal is input to the input terminal 105 and an L signal (a low potential side power supply GND) is input to the input terminal 106, the potential at the terminal 107 is increased and the gate-source voltage of the transistor 101 reaches the threshold voltage, and then, the transistor 101 is turned OFF, thus the terminal 107 is brought into a floating state. Therefore, if the transistor 102 is ON at the point when the transistor 101 is turned OFF, the gate-source voltage of the transistor 102 is held in the capacitor 104. Therefore, the potentials at the terminals 108 and 107 are increased sufficiently.

As described above, even a general CMOS circuit in which the conductivity of P-channel type transistors is inverted can operate normally by using the transistors 101 and 109, the capacitor 104 and the like. This can be applied to various circuits as well as an inverter circuit.

It is to be noted that although the drain terminal of the transistor 102 in FIG. 2 is connected to a wiring having the potential VDD, the invention is not limited to this. The potential at the drain terminal of the transistor 102 may be changed depending on the condition. For example, it may be input with a pulse signal. Similarly, although each of the source terminals of the transistors 103 and 109 is connected to a wiring having the potential GND, the invention is not limited to this. Each of the potentials at the source terminals of the transistors 103 and 109 may be changed depending on the condition, and it may be input with a different potential or a signal.

Figure 4:
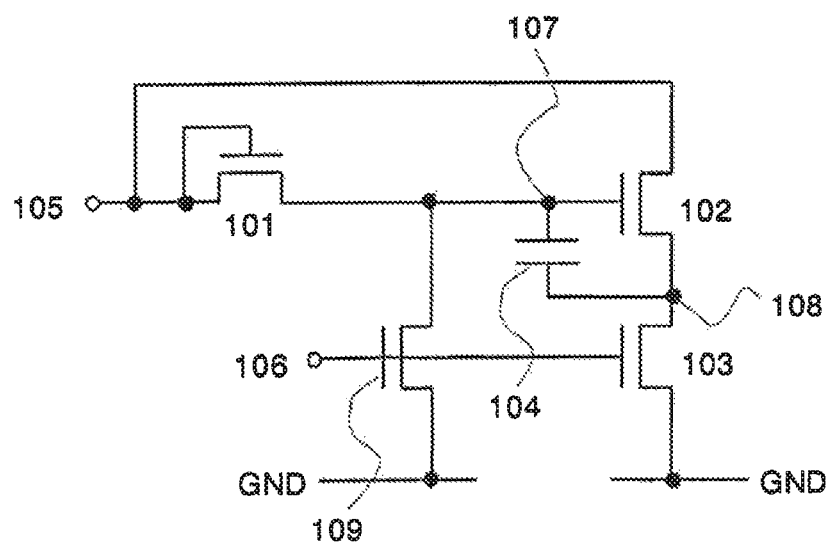
FIG. 4 is a diagram showing the configuration of a circuit in the case of applying the invention to an inverter circuit.

For example, the drain terminal of the transistor 102 may be connected to the input terminal 105 of the transistor 102 as shown in FIG. 4. In this case also, when an H signal (high potential side power supply VDD) is input to the input terminal 106 and an L signal (low potential side power supply GND) is input to the input terminal 105, the potential at the output terminal 108 becomes equal to GND, and when an L signal (low potential side power supply GND) is input to the input terminal 106 and an H signal (high potential side power supply VDD) is input to the input terminal 105, the potential at the output terminal 108 becomes equal to VDD. Thus, the circuit operates normally.

Alternatively, when a pulse signal is input to the drain terminal of the transistor 102, a shift register, a latch circuit, or a part of them can be configured.

It is to be noted that although the N-channel transistors are employed in FIG. 2, the invention is not limited to this. P-channel transistors may be employed to configure the circuit, or a CMOS circuit may be employed as well. When adopting P-channel transistors for all of the transistors in the circuit shown in FIG. 2, the potentials of VDD and GND may be replaced with each other.

Figure 5:
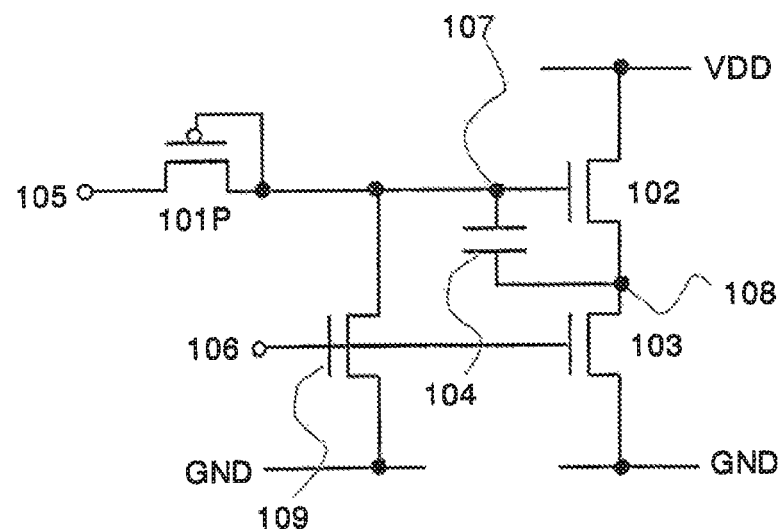
FIG. 5 is a diagram showing the configuration of a circuit in the case of applying the invention to an inverter circuit.

Although the transistor 101 shown in FIG. 2 has the same conductivity as the transistor 102 and the like, the invention is not limited to this. Any element having rectification may be adopted. For example, instead of the transistor 101, a PN junction diode, a PIN junction diode, or a Schottky diode and the like may be adopted. Alternatively, as shown in FIG. 5, a diode-connected transistor 101P whose conductivity is opposite to the transistor 102 and the like may be adopted as well.

In addition, the capacitor 104 may be omitted. That is, it can be substituted with the gate capacitance of the transistor 102. As for the gate capacitance of the transistor 102, it may be formed in an overlapped region of the gate electrode with a source region, a drain region, an LDD region and the like, or formed between the gate electrode and a channel region.

Embodiment Mode 2

In Embodiment Mode 1, the inverter circuit for dealing with the second problem described in the section of the problems to be solved by the invention is described. Described in this embodiment mode is an inverter circuit for dealing with the first problem described therein.

Figure 33:
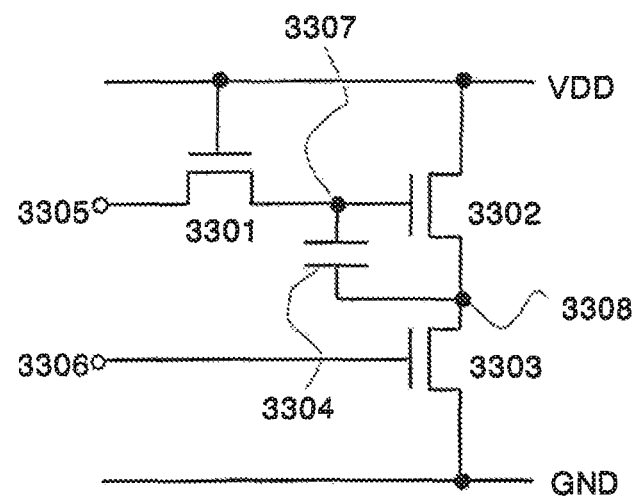
FIG. 33 is a diagram showing the configuration of a conventional inverter circuit.

Now, a factor of the first problem is analyzed with reference to the circuit in FIG. 33 again. When an H signal (high potential side power supply VDD) is input to the input terminal 3306 and an L signal (low potential side power supply GND) is input to the input terminal 3305, the potential at the terminal 3307 becomes equal to the potential of the L signal (low potential side power supply GND). That is, the voltage at both ends (potential difference between both ends) of the capacitor 3304 becomes equal to 0 V.

Next, when an H signal (high potential side power supply VDD) is input to the input terminal 3305 and an L signal (low potential side power supply GND) is input to the input terminal 3306, the potential at the terminal 3307 starts increasing from GND (0 V). Then, when the potential at the terminal 3307 becomes equal to (VDD−VthN) which is lower than VDD by the threshold voltage, it is brought into a floating state. That is, such amount of the potential difference is required to be increased. Therefore, the corresponding charge time has to be provided. This causes the delay of the terminal 3307 to be in the floating state.

Hereupon, according to the invention, the circuit operates without decreasing the potential at the terminal 3307 (or a terminal corresponding to this) down to GND (0 V). However, when a transistor is required to be turned OFF, the potential at the terminal drops to the vicinity of the threshold voltage. As a result, not 0 V but the threshold voltage is stored in the capacitor. Thus, a potential does not have to be increased by a large amount since electric charge is already held in the capacitor. Therefore, the charge time is reduced, thus the time required for bringing the terminal into the floating state is reduced as well.

Based on the principle as described above, the circuit is configured to deal with the first problem.

In this embodiment mode, the first problem is solved by modifying the circuit described in Embodiment Mode 1. Therefore, the first and second problems can be solved at the same time. Thus, the detailed description of the basic configuration and operation is omitted herein as it is the same as in Embodiment Mode 1.

Figure 1:
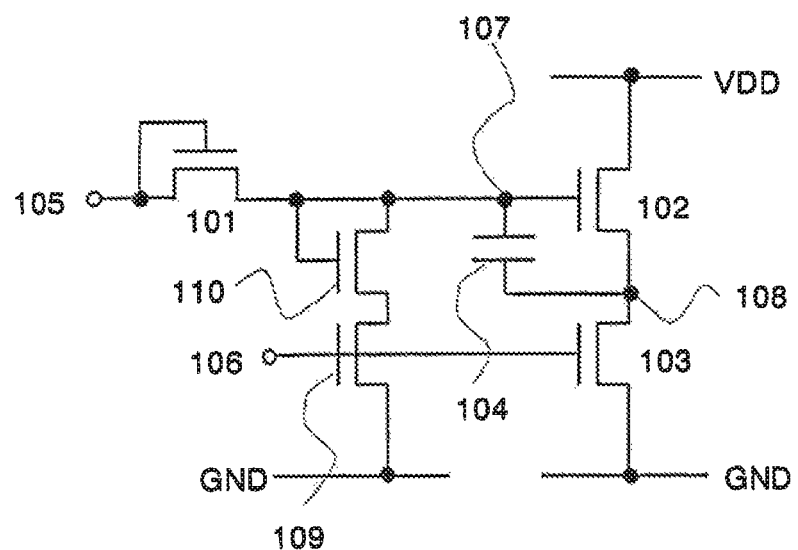
FIG. 1 is a diagram showing the configuration of a circuit in the case of applying the invention to an inverter circuit.
Figure 6:
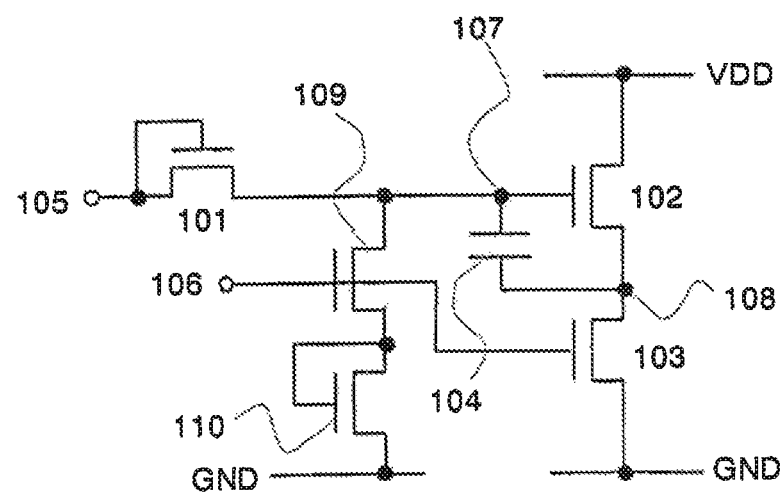
FIG. 6 is a diagram showing the configuration of a circuit the case of applying the invention to an inverter circuit.

FIG. 1 shows a circuit diagram in which the circuit in FIG. 2 is modified to solve both of the first and second problems. In FIG. 1, a transistor 110 which is diode connected (whose gate terminal and drain terminal are connected to each other) is connected in series to the transistor 109 to solve the second problem described in the section of the problems to be solved by the invention. It is to be noted that although the transistor 110 is connected to the drain terminal side of the transistor 109, the invention is not limited to this. For example, the transistor 110 may be connected to the source terminal side of the transistor 109 as shown in FIG. 6.

By disposing the diode-connected transistor 110 as shown in FIG. 1, it becomes possible to prevent the potential at the terminal 107 from being lower than the threshold voltage. That is, the voltage at both terminals (potential difference between both ends) of the capacitor 104 can be set to be not equal to 0 V, but equal to or more than the threshold voltage.

The operation thereof is described now in brief. First, when an H signal (high potential side power supply VDD) is input to the input terminal 106 and an L signal (low potential side power supply GND) is input to the input terminal 105, the transistors 109 and 103 are turned ON. As a result, the potential at the terminal 108 becomes equal to GND. On the other hand, the potential at the terminal 107 becomes equal to the threshold voltage of the transistor 110 since the transistor 101 is OFF, and the transistor 110 is turned OFF when the source-drain voltage of the transistor 110 becomes equal to the threshold voltage as the gate terminal and the drain terminal of the transistor 110 are connected to each other. The voltage at both terminals (potential difference between both terminals) of the capacitor 104 also becomes equal to the threshold voltage as the potential at the terminal 107 is equal to the threshold voltage. Therefore, when the threshold voltage of the transistor 110 is equal to that of the transistor 102, the transistor 102 is turned OFF.

Next, when an H signal (high potential side power supply VDD) is input to the input terminal 105 and an L signal (low potential side power supply GND) is input to the input terminal 106, the transistors 109 and 103 are turned OFF. Since the potential at the input terminal 105 has the potential of the H signal (high potential side power supply VDD), the transistor 101 is turned ON and the potential at the terminal 107 is thus increased. The potential at the terminal 107 starts increasing from the threshold voltage in FIG. 1, whereas it starts increasing from GND (0 V) in FIG. 2. Thus, the potential at the terminal 107 is increased instantly. As a result, the transistor 101 is instantly turned OFF, and thus the terminal 107 is brought into the floating state. At this point, the transistor 102 is ON since the potential at the terminal 108 is still on the increase. Therefore, the problem that the potentials at the terminals 108 and 107 are not increased sufficiently can be solved.

Due to the transistor 110, the potential change at the terminal 107 can be suppressed small, thus the potential can change instantly. This contributes to the faster circuit operation.

By adopting such a configuration, the first and second problems described in the section of the problems to be solved by the invention can be solved at the same time.

Figure 7:
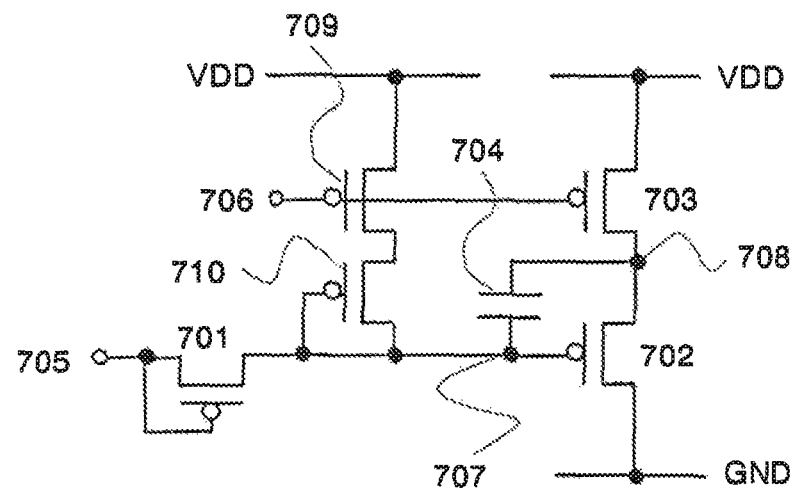
FIG. 7 is a diagram showing the configuration of a circuit in the case of applying the invention to an inverter circuit.

It is to be noted although N-channel type transistors are employed in FIGS. 1 and 6, the invention is not limited to this. When employing P-channel type transistors for all of the transistors in the circuits in FIGS. 1 and 6, the potentials of VDD and GND may be replaced with each other. FIG. 7 shows a circuit diagram in the case where all the transistors in the circuit in FIG. 1 are P-channel transistors.

It is also to be noted that although the transistor 110 in FIGS. 1 and 6 has the same conductivity as the transistor 102 and the like, the invention is not limited to this. Any element having rectification can be adopted. For example, instead of the transistor 110, a PN junction diode, a PIN junction diode, a Schottky diode, a diode-connected transistor having the opposite conductivity to that of the transistor 102 and the like may be adopted. That is, the potential at the terminal 107 has only to be prevented from dropping to a certain level.

However, it is desirable that the transistors 110 and 102 have the same conductivity and the same threshold voltage in rough. This is because in the case where the threshold voltage of the transistor 110 is different from that of the transistor 102, the transistor 102 may be turned ON when an H signal (high potential side power supply VDD) is input to the input terminal 105 and an L signal (low potential side power supply GND) is input to the input terminal 106. Thus, characteristics of the transistors 110 and 102 are desirably set to be uniform by disposing them adjacently to each other and the like. In the case of crystallizing their semiconductor layers by laser irradiation for example, the transistors 110 and 102 are desirably irradiated with the same shot. However, the threshold voltages of the transistors 110 and 102 may have some small variations as long as they have no influence on the operation.

It is to be noted that described in this embodiment is the modified example of the circuit shown in Embodiment Mode 1. Thus, the description of Embodiment Mode 1 can be applied to this embodiment as well.

Embodiment Mode 3

Described in this embodiment mode is the inverter circuit for dealing with the first and second problems described in the section of the problems to be solved by the invention, which is obtained by modifying the circuit described in Embodiment Mode 1. In this embodiment mode, an inverter circuit for dealing with the first problem is described by modifying the circuit in FIG. 34.

Figure 8:
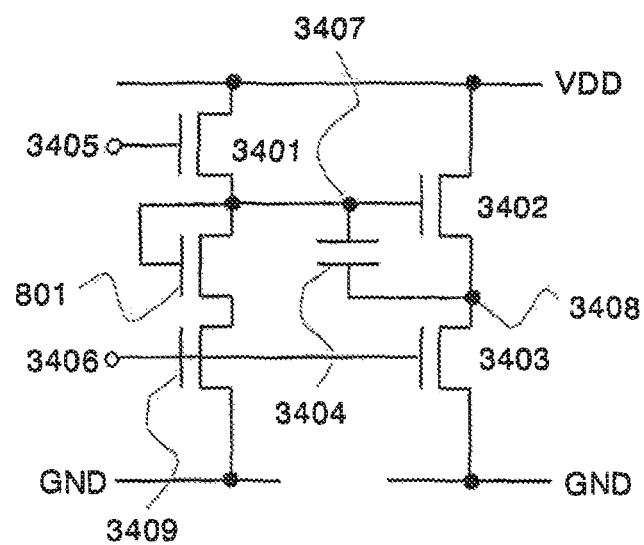
FIG. 8 is a diagram showing the configuration of a circuit in the case of applying the invention to an inverter circuit.
Figure 9A:
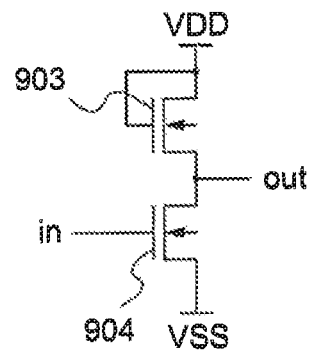
FIGS. 9A to 9C are diagrams showing the configuration and operations of a conventional inverter circuit.
Figure 9B:
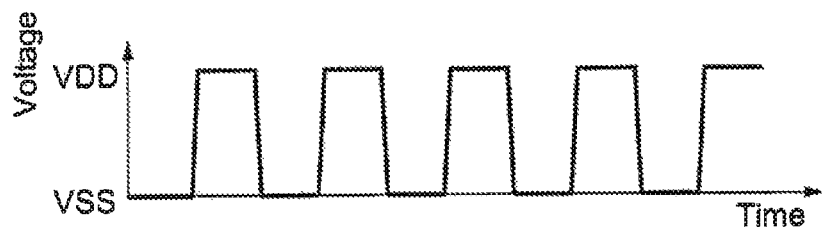
Figure 9C:
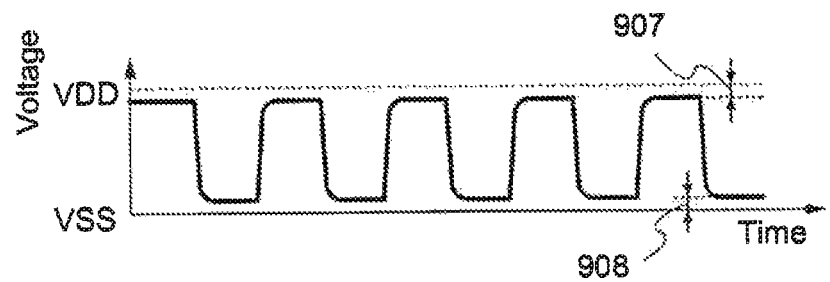
Figure 34:
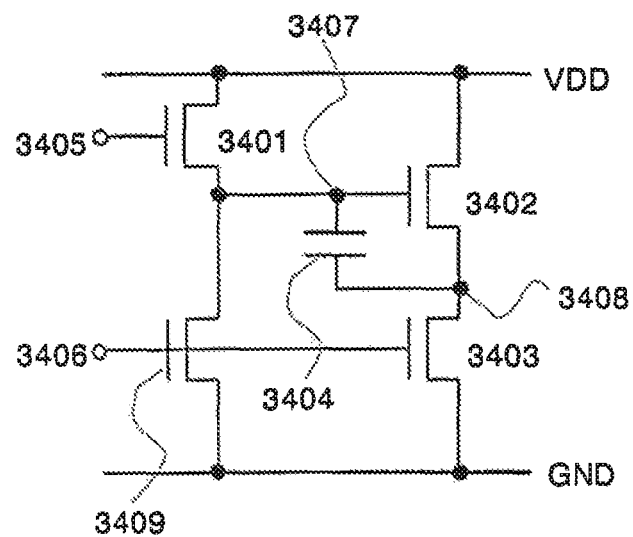
FIG. 34 is a diagram showing the configuration of a conventional inverter circuit.

FIG. 8 shows a modified inverter circuit of FIG. 34. A diode-connected transistor 801 is connected in series to a transistor 3409. It is to be noted that although the transistor 801 is disposed between the drain terminal of the transistor 3409 and the terminal 3407, the invention is not limited to this. For example, it may be connected to the source terminal side of the transistor 3409.

As described above, by disposing the transistor 801, the potential at the terminal 3407 is prevented from dropping to a large degree. Therefore, the potential at the terminal 3407 is increased quickly. As a result, the transistor 3401 is instantly turned OFF, thus the terminal 3407 is brought into the floating state. At this point, the transistor 3402 is ON as the potential at the terminal 3408 is still on the increase. Therefore, it becomes possible to deal with the problem that the potentials at the terminals 3408 and 3407 are not increased sufficiently.

Due to the transistor 801, the potential change at the terminal 3407 can be suppressed, thus the potential can change instantly. This contributes to the faster circuit operation.

By the configuration as described above, both of the first and second problems described in the section of the problems to be solved by the invention can be solved at the same time.

It is to be noted that although N-channel type transistors are employed in FIG. 8, the invention is not limited to this. P-channel type transistors may be employed to configure the circuit, or a CMOS type circuit may be employed as well. When adopting P-channel type transistors for all of the transistors in the circuit shown in FIG. 8, the potentials of VDD and GND may be replaced with each other.

It is to be noted that although the transistor 801 shown in FIG. 8 has the same conductivity as the transistor 3402 and the like, the invention is not limited to this. Any element having rectification may be adopted. For example, instead of the transistor 801, a PN junction diode, a PIN junction diode, a Schottky diode, a diode-connected transistor having the opposite conductivity to that of the transistor 3402 and the like may be adopted. That is, the potential at the terminal 3407 has only to be prevented from dropping to a certain level.

However, it is desirable that the transistors 801 and 3402 have the same conductivity and the same threshold voltage in rough. This is because in the case where the threshold voltage of the transistor 801 is different from that of the transistor 3402, the transistor 3402 may be turned ON when an H signal (high potential side power supply VDD) is input to the input terminal 3405 and an L signal (low potential side power supply GND) is input to the input terminal 3406. Thus, characteristics of the transistors 801 and 3402 are desirably set to be uniform by disposing them adjacent to each other and the like. In the case of crystallizing their semiconductor layers by laser irradiation for example, the transistors 801 and 3402 are desirably irradiated with the same shot. However, the threshold voltages of the transistors 801 and 3402 may have some small variations as long as they have no influence on the operation.

Embodiment Mode 4

Described in Embodiment Modes 1 to 3 is the case of applying the invention to the inverter circuit. In this embodiment, the case where the invention is applied to a circuit other than the inverter circuit is described.

Figure 10:
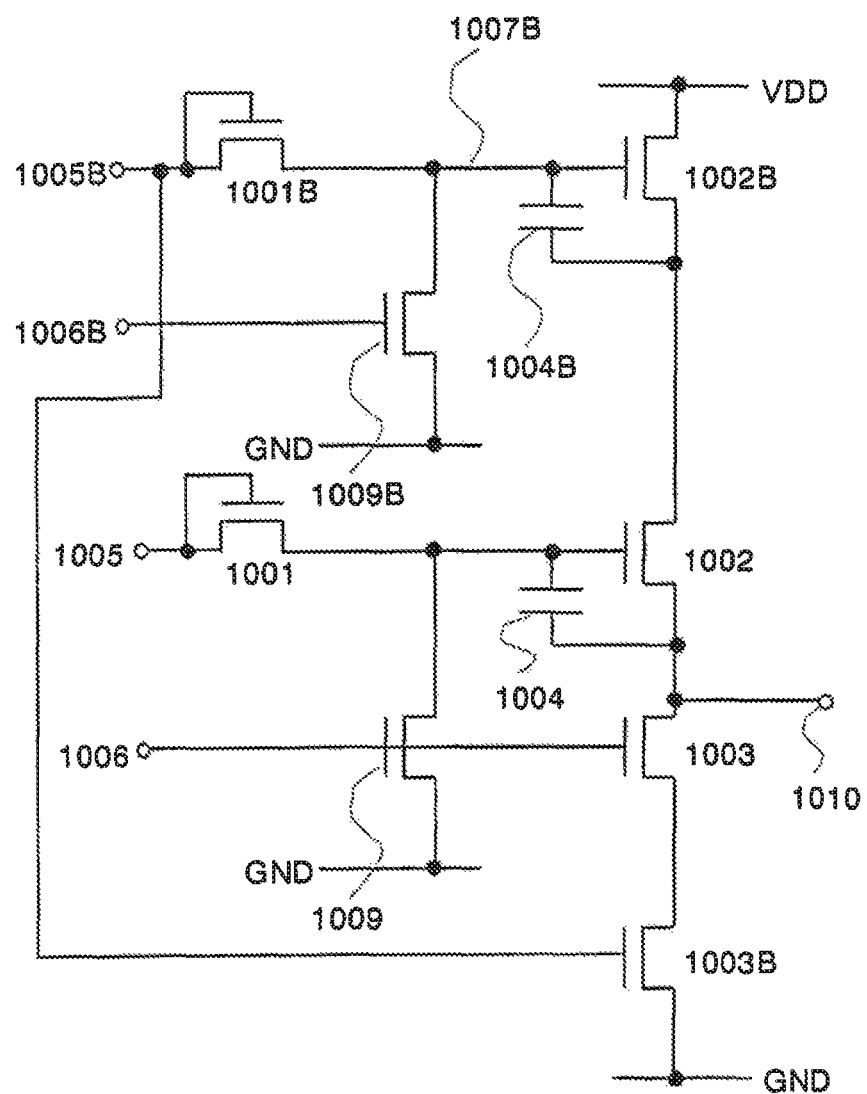
FIG. 10 is a diagram showing the configuration of a circuit in the case of applying the invention to a clocked inverter circuit.

FIG. 10 shows the configuration of a clocked inverter circuit to which the invention is applied. The circuit shown in FIG. 10 is configured by extending the inverter circuit shown in FIG. 2. However, it is also possible to configure a clocked inverter circuit by extending the alternative circuit shown in any one of Embodiment Modes 1 to 3.

In FIG. 10, transistors 1002B and 1003B control whether or not to output a signal to an output terminal of the clocked inverter circuit. Generally, ON/OFF is controlled in synchronism with a clock signal, a sampling pulse signal and the like. Thus, the transistors 1002B and 1003B are simultaneously turned ON/OFF in synchronism with a signal input to an input terminal 1005B. On the other hand, transistors 1002 and 1003 invert an input signal which is input to an input terminal 1005 so as to be output to an output terminal 1010.

As shown in FIG. 10, the amplitude of an output signal is prevented from being decreased by using transistors 1001, 1009, 1001B and 1009B, capacitors 1004 and 1004B and the like to P-channel transistors in the case of configuring a CMOS type clocked inverter. Although the gate terminal of the transistor 1003B is connected to the input terminal 1005B in FIG. 10, the invention is not limited to this. The gate terminal of the transistor 1003B may be connected to a terminal 1007B.

Alternatively, a diode-connected transistor may be connected in series to the transistors 1009, 1009B and the like as in FIG. 1. It is also possible to configure a clocked inverter by extending the inverter circuit shown in FIG. 8 by changing the connection of the transistors 1001 and 1001B to that of the transistor 3401 shown in FIG. 8.

The operation of the circuit in FIG. 10 is the same as those described in Embodiment Modes 1 to 3, therefore, it is omitted herein.

Figure 11:
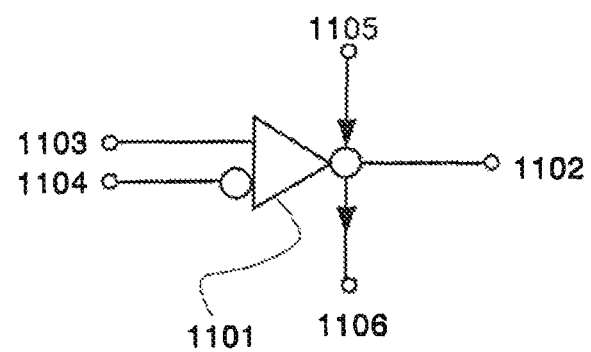
FIG. 11 is a diagram showing a symbol expressing a clocked inverter circuit.

Hereupon, a symbol 1101 representing the clocked inverter of this embodiment mode is shown in FIG. 11. A terminal 1105 corresponds to the terminal 1005B and a terminal 1106 corresponds to the terminal 1006B, A pair of signals inverted from each other is input to each of the terminals 1105 and 1106. When an H signal is input to the terminal 1105, the signal is output to an output terminal 1102. An input terminal 1103 corresponds to the terminal 1006 and an input terminal 1104 corresponds to the terminal 1005. Taking account of this circuit as a clocked inverter circuit, a signal input to the input terminal 1103 is inverted and output to the output terminal 1102. Therefore, the terminal 1103 corresponds to an input terminal of the clocked inverter circuit. A pair of signals inverted from each other is input to each of the terminals 1103 and 1104.

Figure 12:
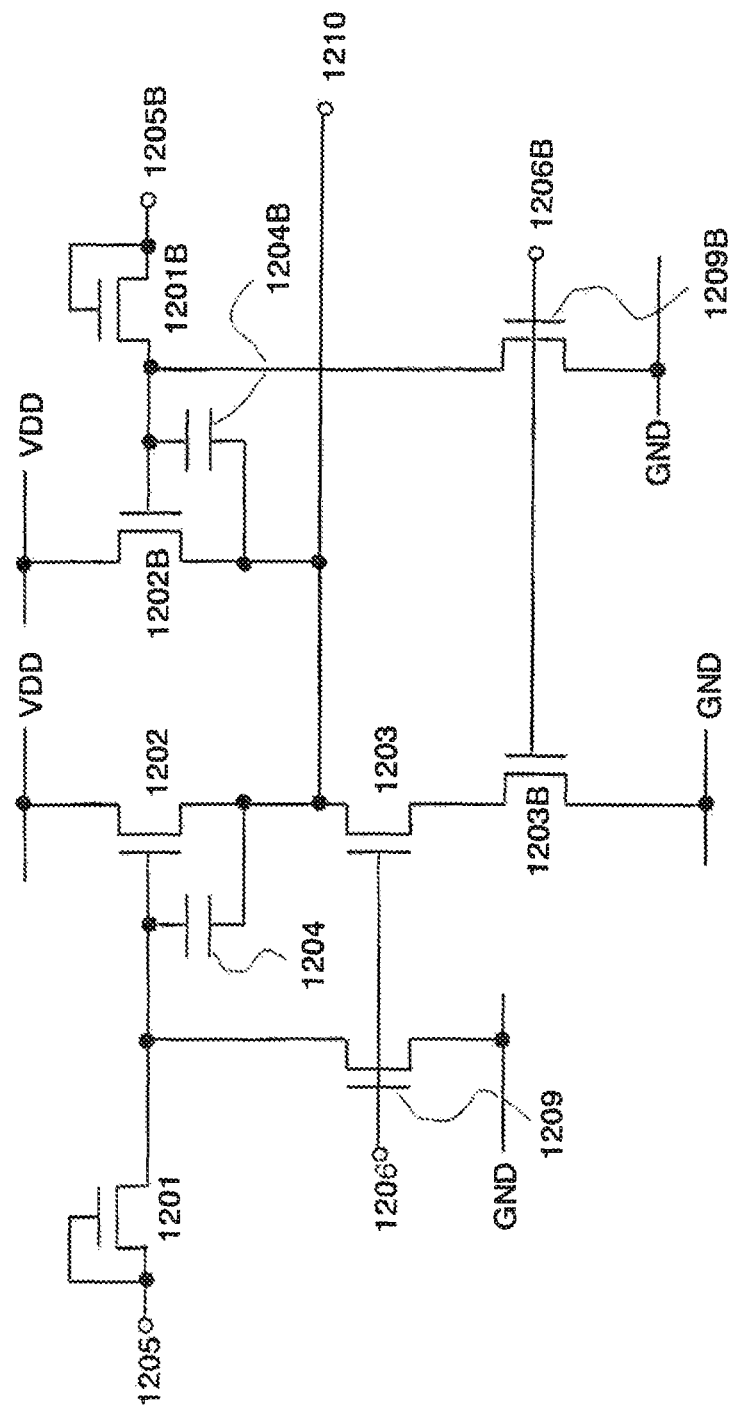
FIG. 12 is a diagram showing the configuration of a circuit in the case of applying the invention to a NAND circuit.

FIG. 12 shows the configuration of a NAND circuit to which the invention is applied. The circuit shown in FIG. 12 is configured by extending the inverter circuit shown in FIG. 2. However, it is also possible to configure a NAND circuit by extending the alternative circuit shown in any one of Embodiment Mode 1 to 3.

In FIG. 12, the amplitude of an output signal is prevented from being decreased by using transistors 1201, 1209, 1201B and 12092, capacitors 1204 and 12042 and the like to P-channel type transistors, namely to transistors 1202 and 1202B in the case of configuring a CMOS type NAND circuit. As for N-channel type transistors in the case of configuring a CMOS NAND circuit, namely transistors 1203 and 1203B are used without any modifications.

Alternatively, a diode-connected transistor may be connected in series to the transistors 1209 and 12092 and the like. It is also possible to configure a NAND circuit by extending the inverter circuit in FIG. 8 by changing each configuration of the transistors 1201 and 1201B to that of the transistor 3401 in FIG. 8.

The operation of the circuit in FIG. 12 is the same as those described in Embodiment Modes 1 to 3, therefore, it is omitted herein.

Figure 13:
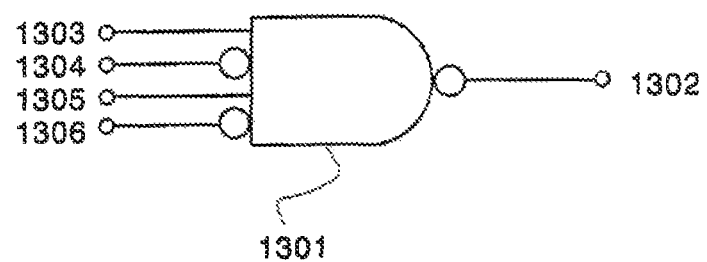
FIG. 13 is a diagram showing a symbol expressing a NAND circuit to which the invention is applied.

Hereupon, a symbol 1301 representing the NAND circuit of this embodiment mode is shown in FIG. 13. An input terminal 1303 corresponds to the terminal 1206 and an input terminal 1305 corresponds to the terminal 1206B. An input terminal 1304 corresponds to the terminal 1205 and an input terminal 1306 corresponds to the terminal 1205B. A pair of signals inverted from each other is input to each of the terminals 1303 and 1304, and a pair of signals inverted from each other is input to each of the terminals 1305 and 1306. An output terminal 1302 corresponds to the terminal 1201. Taking account of the logic operation of this circuit as a NAND circuit, each of the terminals 1303 and 1305 corresponds to an input terminal of a NAND circuit.

Figure 14:
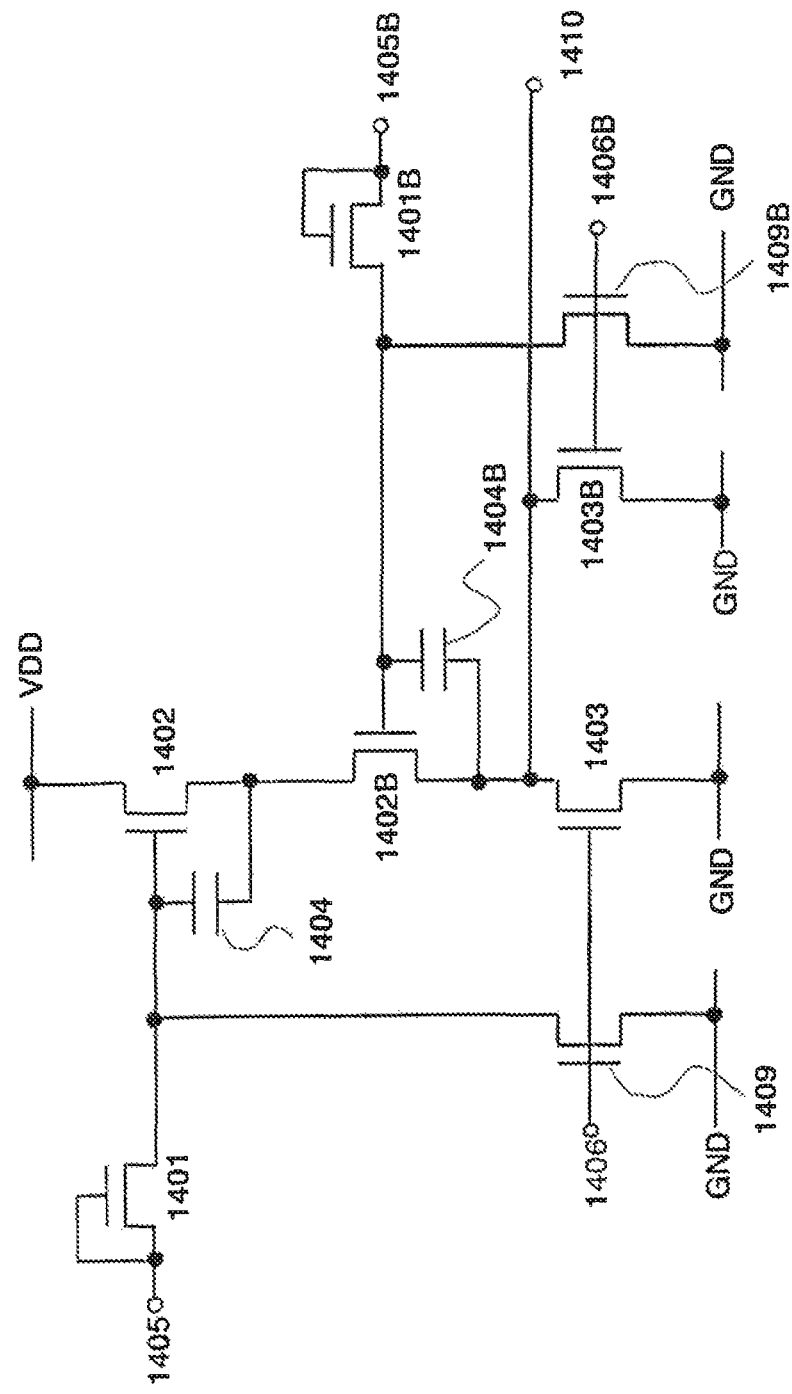
FIG. 14 is a diagram showing the configuration of a circuit in the case of applying the invention to a NOR circuit.

FIG. 14 shows the configuration of a NOR circuit to which the invention is applied. The circuit shown in FIG. 14 is configured by extending the inverter circuit shown in FIG. 2. However, it is also possible to configure a NOR circuit by using the alternative circuit shown in any one of Embodiment Modes 1 to 3.

In FIG. 14 also, the amplitude of an output signal is prevented from being decreased by using transistors 1401, 1409, 1401B and 1409B, capacitors 1404 and 1404B and the like to P-channel type transistors, namely to transistors 1402 and 1402B in the case of configuring a CMOS type NOR circuit. As for N-channel type transistors in the case of configuring a CMOS type NOR circuit, namely transistors 1403 and 1403B are used without any modifications.

Alternatively, a diode-connected transistor may be connected in series to the transistors 1409, 1409B and the like. It is also possible to configure a NOR circuit by extending the inverter circuit in FIG. 8 by changing the connection of the transistors 1401 and 1401B to that of the transistor 3401 in FIG. 8.

The operation of the circuit in FIG. 14 is the same as those described in Embodiment Modes 1 to 3, therefore, it is omitted herein.

Figure 15:
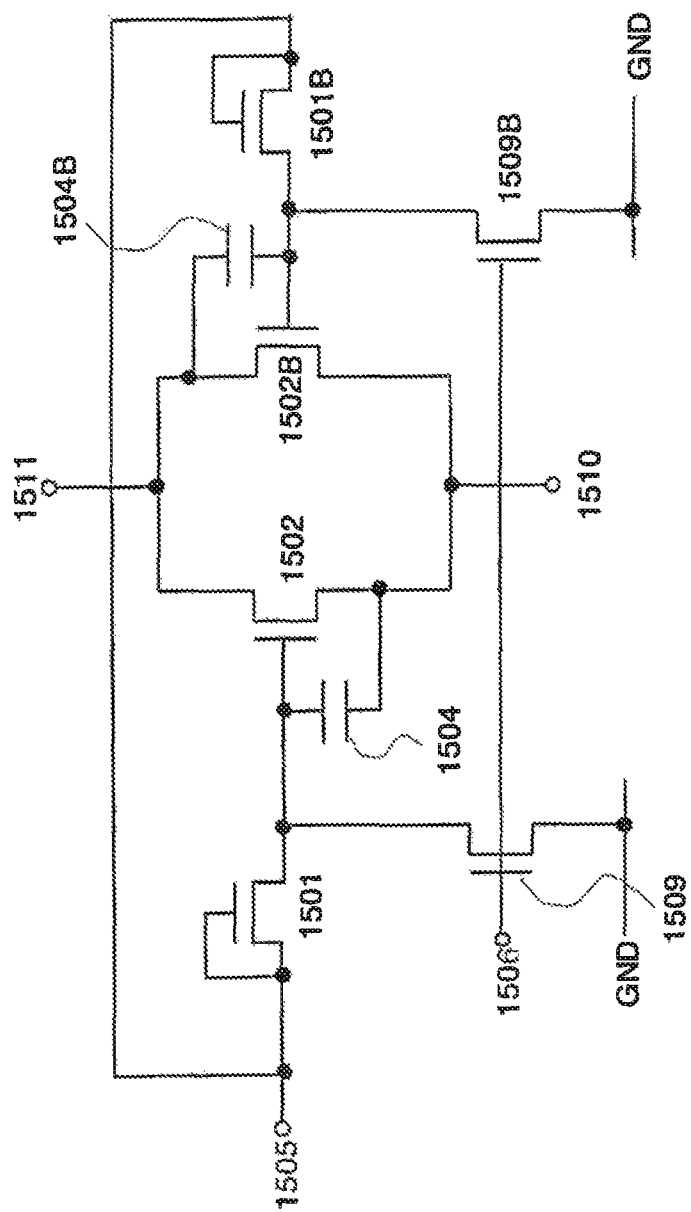
FIG. 15 is a diagram showing the configuration of a circuit in the case of applying the invention to a transfer gate circuit.

FIG. 15 shows the configuration of a transfer gate circuit (analog switch circuit) to which the invention is applied. The circuit in FIG. 15 is configured by extending the inverter circuit shown in FIG. 2. However, it is also possible to configure a transfer gate circuit by extending the alternative circuit shown in any one of Embodiment Modes 1 to 3.

In the case of FIG. 15, which potential at the terminal 1510 or 1511 becomes higher is dependent on the condition. Thus, it is not clear which terminal corresponds to the source terminal. Thus, in FIG. 15, a transistor 1502 and a transistor 1502B are disposed in parallel to each other, and a capacitor 1504 and a capacitor 1504B are disposed in a different connection. Therefore, the potentials at the gate terminals of the transistors 1502 and 1502B can be increased sufficiently regardless of which potential at the terminal 1510 or 1511 is lower.

Thus, in the case of a CMOS type transfer gate circuit, the amplitude of an output signal is prevented from being decreased by using transistors 1501, 1509, 1501B and 1509B, capacitors 1504 and 1504B and the like to both P-channel type and N-channel type transistors, not only to P-channel type transistors. In this manner, by connecting a diode-connected transistor, a capacitor and the like to a transistor in which the amplitude of an output signal is decreased, a normal circuit operation is achieved.

Alternatively, a diode-connected transistor may be connected in series to the transistors 1509, 1509B and the like as in FIG. 1. It is also possible to configure a transfer gate circuit by extending the inverter circuit in FIG. 8 by changing the connection of the transistors 1501 and 1501B to that of the transistor 3401 in FIG. 8.

The operation of the circuit in FIG. 15 is the same as those described in Embodiment Modes 1 to 3, therefore, it is omitted herein.

Although N-channel type transistors are employed in FIGS. 10, 12, 14 and 15, the invention is not limited to them. When employing P-channel transistors for all the transistors in the circuits shown in FIGS. 10, 12, 14 and 15, the potentials of VDD and GND may be replaced with each other.

Various circuits such as a NAND circuit to which the invention is applied have heretofore been described in this embodiment mode; however, the application of the invention is not limited to them. It can be applied to other various circuits.

It is to be noted that described in this embodiment mode are the extended circuits of the ones described in Embodiments 1 to 3. Therefore, the description of Embodiment Modes 1 to 3 can all be applied to this embodiment mode.

Embodiment Mode 5

In Embodiment Mode 1, it is described that not only the terminal 108 but also the terminal 107 may be employed as an output terminal of the inverter circuit in FIG. 2. According to the present embodiment mode, various circuit configurations are described by utilizing an output of the output terminal 107. That is, described here is the case in which various circuits are operated by operating an inverter circuit which outputs a signal from the terminal 108 as a level correction circuit.

Figure 16:
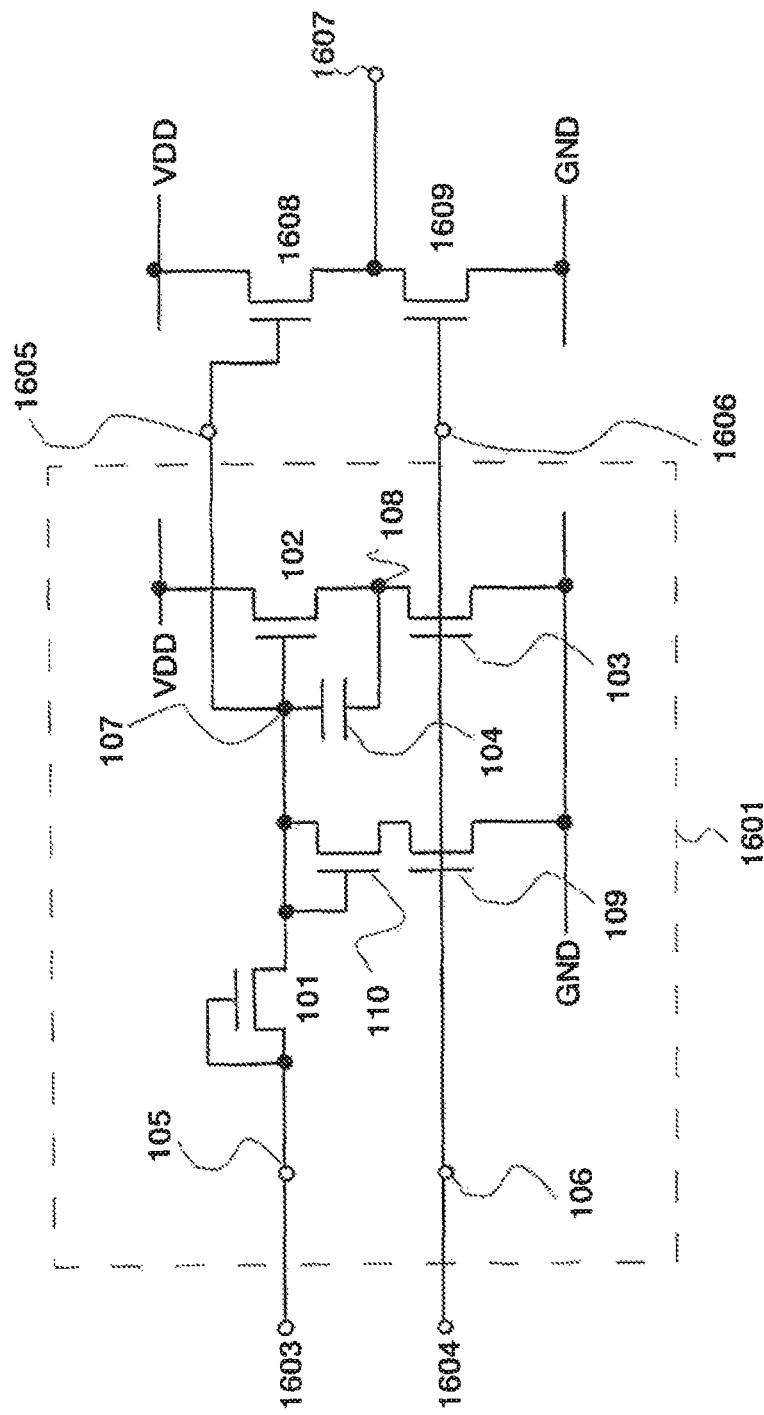
FIG. 16 is a diagram showing the configuration of a circuit in the case of applying the invention to an inverter circuit.

First, FIG. 16 shows an inverter circuit to which the invention is applied. In FIG. 16, the inverter circuit shown in FIG. 1 is used as a level correction circuit and the terminal 107 is used as an output terminal so as to be connected to an input terminal of another circuit (inverter circuit here). The circuit (inverter circuit here) is operated normally by using a signal output from a level correction circuit 1601.

Input terminals 1603 and 1604 of the level correction circuit 1601 are connected to the terminals 105 and 106 respectively. An output terminal 1605 of the level correction circuit 1601 is connected to the terminal 107 and an output terminal 1606 is connected to the terminal 106.

A pair of signals inverted from each other is input to each of the input terminals 1603 and 1604. Then, the signal from the input terminal 1604 is directly output to the output terminal 1606, while a signal from the input terminal 1603 is output to the output terminal 1605 after its potential is adjusted. Specifically, in the case of an H signal, the higher potential is output.

Thus, in the case of configuring a CMOS type inverter circuit, the amplitude of an output signal is prevented from being decreased by connecting a P-channel type transistor to the output terminal 1605.

In FIG. 16, the output terminal 1605 of the level correction circuit 1601 is connected to the gate terminal of a transistor 1608 and the output terminal 1606 is connected to the gate terminal of a transistor 1609. As a result, a signal is output to an output terminal 1607 without being reduced of its amplitude.

As described above, in the case of configuring a CMOS type circuit, a signal from the output terminal 1605 is input to the gate terminal of a P-channel type transistor. As a result, a normal circuit operation is achieved.

The configuration of the level correction circuit is not limited to that shown in FIG. 16. The circuits described in any one of Embodiment Modes 1 to 3 can be used arbitrarily.

When representing the circuit in FIG. 16 by the symbol 301 shown in FIG. 3, the terminal 1604 corresponds to the terminal 303, the terminal 1603 corresponds to the terminal 304 and the terminal 1607 corresponds to the terminal 302.

Figure 17:
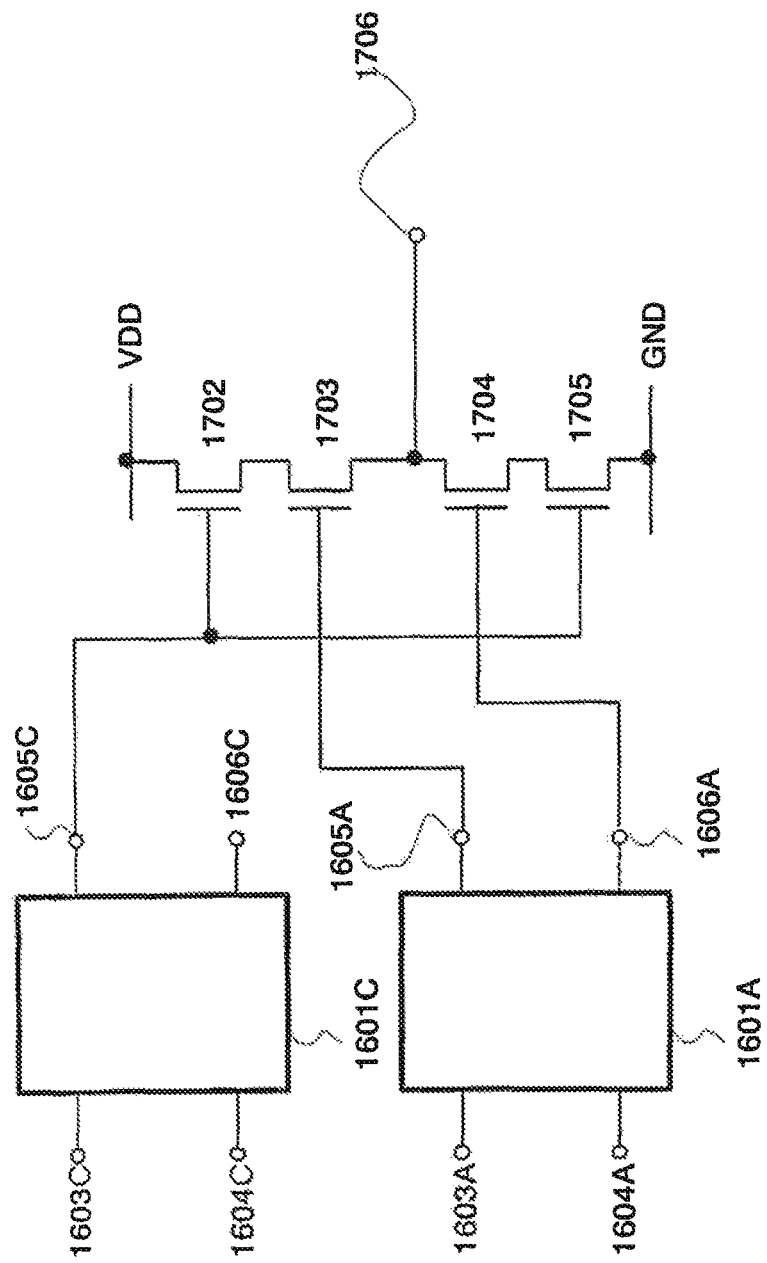
FIG. 17 is a diagram showing the configuration of a circuit in the case of applying the invention to a clocked inverter circuit.

Similarly, FIG. 17 shows the configuration of a clocked inverter to which the invention is applied. Transistors 1702 and 1705 are simultaneously turned ON/OFF by using a level correction circuit 1601C and transistors 1703 and 1704 are controlled by using a level correction circuit 1601A.

Since the gate terminals of the transistors 1702 and 1703 may be supplied with high potentials, the amplitude of an output signal is prevented from being decreased.

When representing the circuit in FIG. 17 by the symbol 1101 showing the clocked inverter circuit in FIG. 11, a terminal 1604A corresponds to the terminal 1103, a terminal 1603A corresponds to the terminal 1104 and a terminal 1604C corresponds to the terminal 1106. In addition, a terminal 1603C corresponds to the terminal 1105 and a terminal 1706 corresponds to the terminal 1102.

Figure 18:
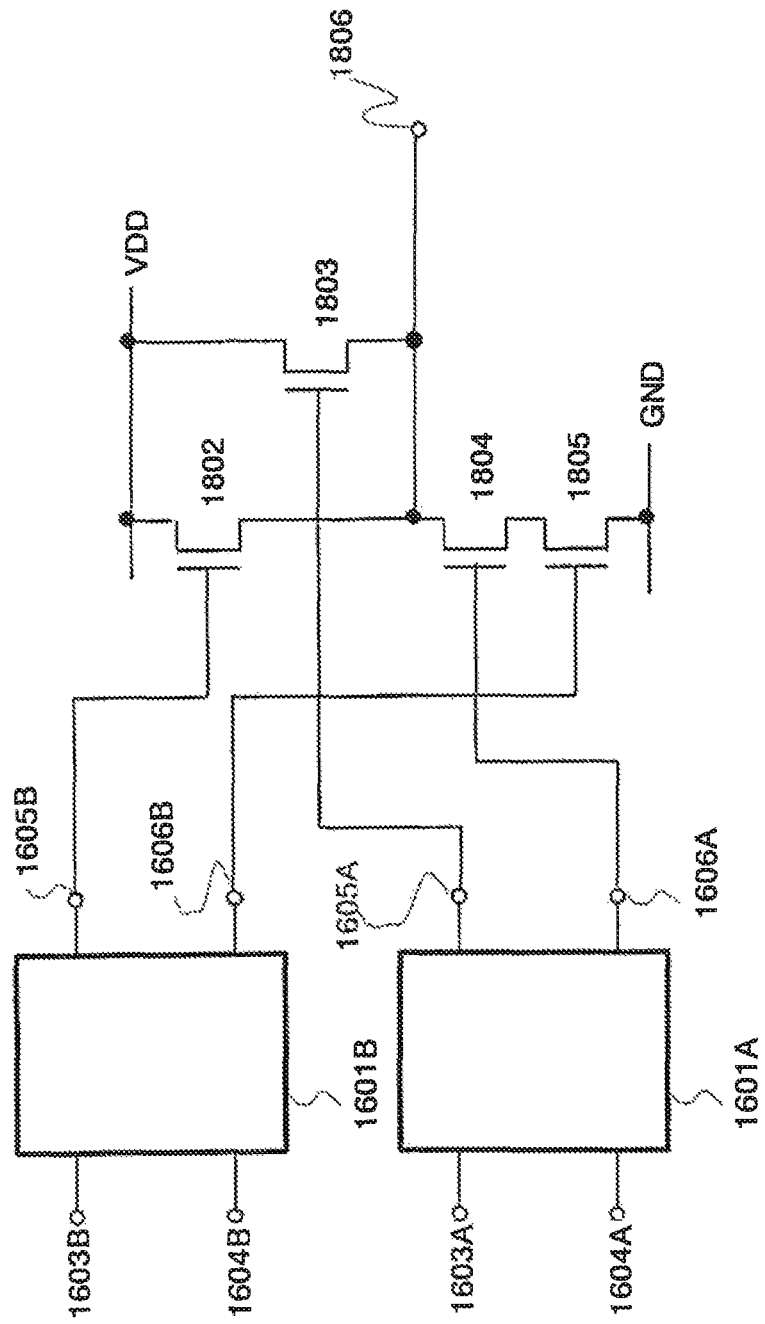
FIG. 18 is a diagram showing the configuration of a circuit in the case of applying the invention to a NAND circuit.

Similarly, FIG. 18 shows the configuration of a NAND circuit to which the invention is applied. Transistors 1802 and 1805 are controlled by using a level correction circuit 1601B and transistors 1803 and 1804 are controlled by using the level correction circuit 1601A.

Since the gate terminals of the transistors 1802 and 1803 can be supplied with high potentials, the amplitude of an output signal is prevented from being decreased.

When representing the circuit in FIG. 18 by the symbol 1301 showing the NAND circuit in FIG. 13, the terminal 1604A corresponds to the terminal 1303 and the terminal 1603A corresponds to the terminal 1304 and a terminal 1604B corresponds to the terminal 1105. In addition, a terminal 1603B corresponds to the terminal 1306 and a terminal 1806 corresponds to the terminal 1302.

Figure 19:
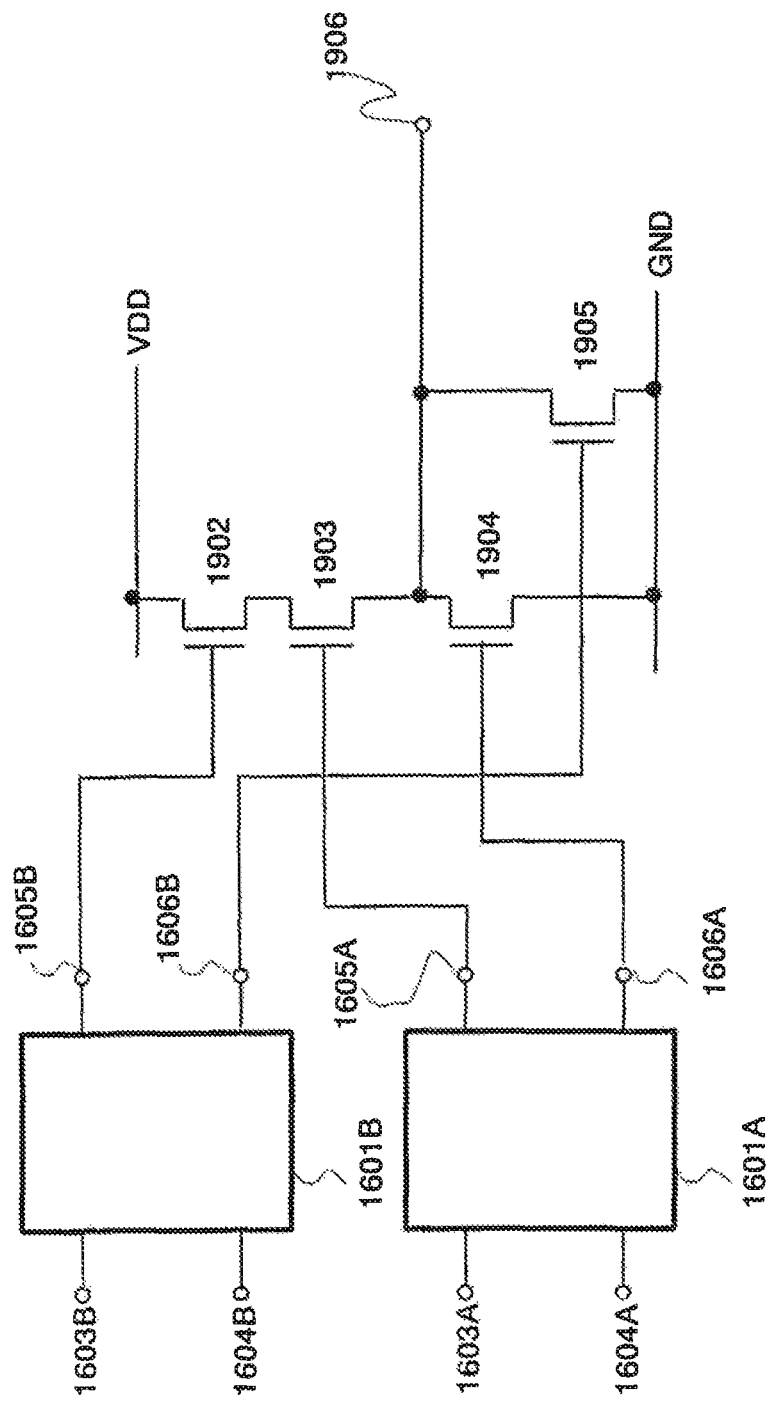
FIG. 19 is a diagram showing the configuration of a circuit in the case of applying the invention to a NOR circuit.

Similarly, FIG. 19 shows the configuration of a NOR circuit to which the invention is applied. Transistors 1902 and 1905 are controlled by using the level correction circuit 1601B and transistors 1903 and 1904 are controlled by using the level correction circuit 1601A.

Since the gate terminals of the transistors 1902 and 1903 can be supplied with high potentials, the amplitude of an output signal of the output terminal 1906 is prevented from being decreased.

Figure 20:
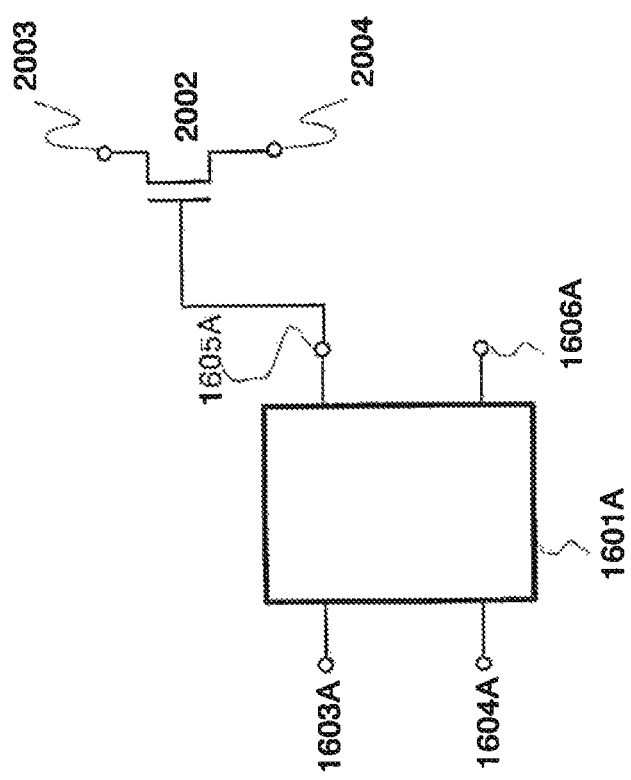
FIG. 20 is a diagram showing the configuration of a circuit in the case of applying the invention to a transfer gate circuit.

Similarly, the configuration of a transfer gate circuit to which the invention is applied is shown in FIG. 20. A transistor 2003 is controlled by using the level correction circuit 1601A.

Since the gate terminal of the transistor 2002 can be supplied with a high potential, the amplitude of a signal from input/output terminals 2003 and 2004 is prevented from being decreased.

Described heretofore is the case of disposing one output terminal as shown in FIGS. 16 to 20. However, when connecting another circuit next to the circuit, an inverted signal is frequently required. Hereupon, examples of disposing two output terminals and outputting an inverted signal are described below.

Figure 21:
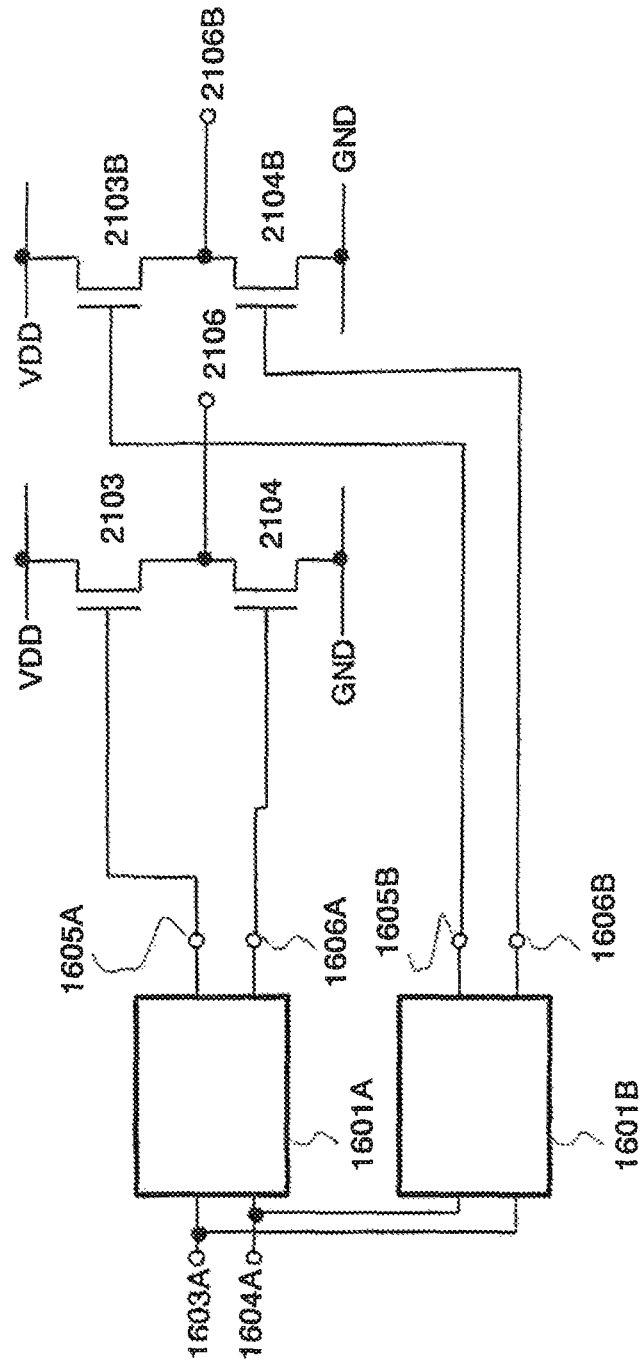
FIG. 21 a diagram showing the configuration of a circuit in the case of applying the invention to an inverter circuit.

FIG. 21 shows the configuration of an inverter to which the invention is applied. One inverter circuit includes transistors 2103 and 2104 while another inverter circuit includes transistors 2103B and 2104B. When a pair of signals inverted from each other is input to each of the inverter circuits, a pair of signals inverted from each other can be output.

However, each of the gate terminals of the transistors 2103 and 2103B is required to be input with a potential which is higher than VDD. Further, each of the gate terminals of the transistors 2103 and 2103B is required to be input with a pair of signals inverted from each other. Thus, the two level correction circuits 1601A and 1601B are required.

Figure 22:
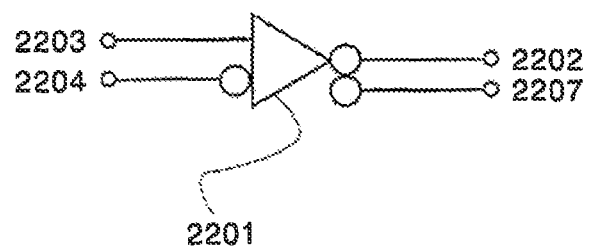
FIG. 22 is a diagram showing a symbol expressing an inverter circuit to which the invention is applied.

FIG. 22 shows a symbol 2201 representing the circuit in FIG. 21. A signal input to an input terminal 2203 is inverted and output to an output terminal 2202. An inverted signal of the signal at the input terminal 2203 is input to an input terminal 2204, and an inverted signal of the signal at the output terminal 2202 is output to an output terminal 2207. Therefore, the terminal 1604A corresponds to the terminal 2203 and the terminal 1603A corresponds to the terminal 2204. In addition, the terminal 2106 corresponds to the terminal 2202 and a terminal 2106B corresponds to the terminal 2207.

Figure 23:
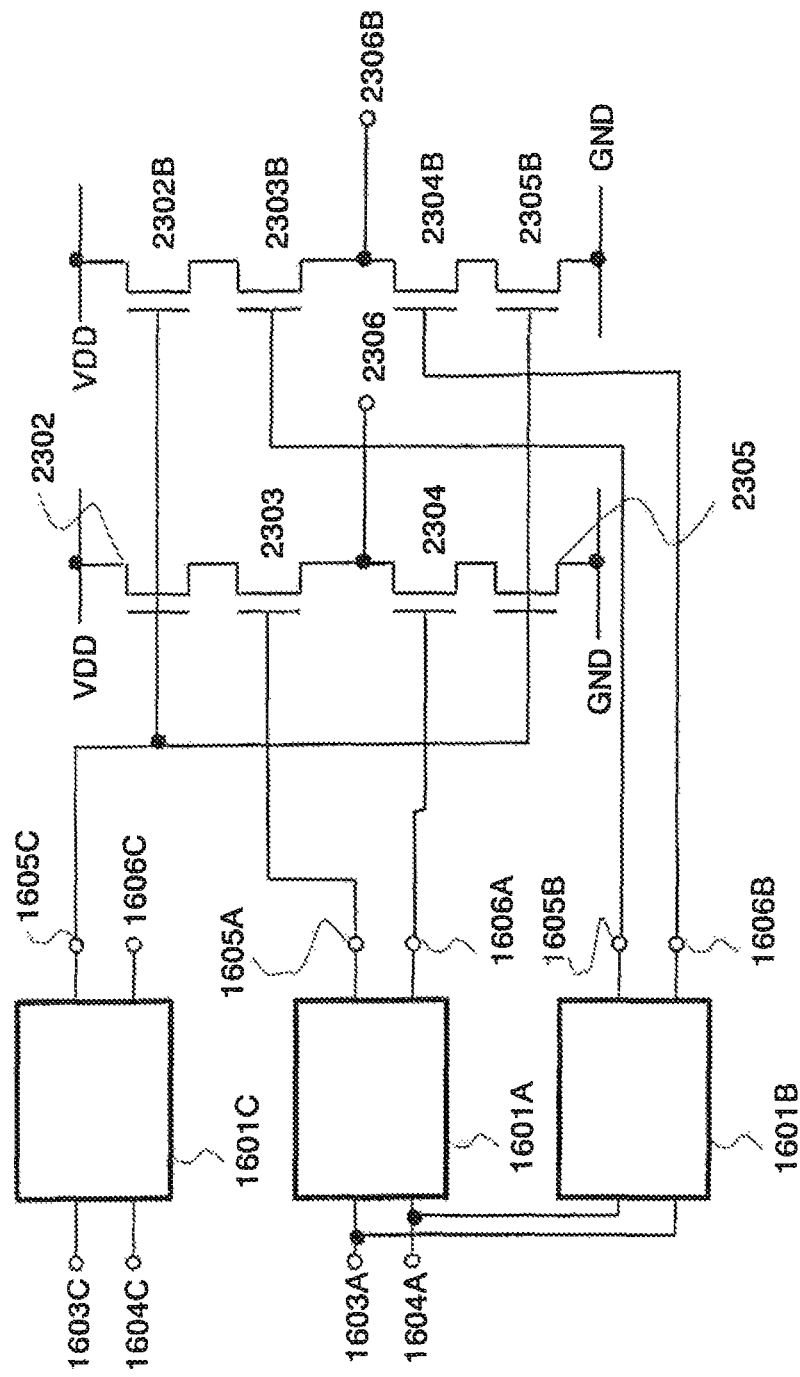
FIG. 23 is a diagram showing the configuration of a circuit in the case of applying the invention to a clocked inverter circuit.

Similarly, FIG. 23 shows the configuration of a clocked inverter to which the invention is applied. One clocked inverter circuit includes transistors 2302, 2303, 2304 and 2305 while another clocked inverter circuit includes transistors 2302B, 2303B, 2304B and 2305B. When each of the clocked inverter circuits is input with a pair of signals inverted from each other, a pair of signals inverted from each other can be output.

However, each of the gate terminals of the transistors 2303 and 2303B is required to be input with a potential which is higher than VDD. Further, each of the gate terminals of the transistors 2303 and 2303B is required to be input with a pair of signals inverted from each other. Thus, the two level correction circuits 1601A and 1601B are required.

In addition, each of the gate terminals of the transistors 2302 and 2302B is required to be input with a potential which is higher than VDD. However, the gate terminals of the transistors 2302 and 2302B may be input with the same signal. Thus, the one level correction circuit 1601C is required.

Figure 24:
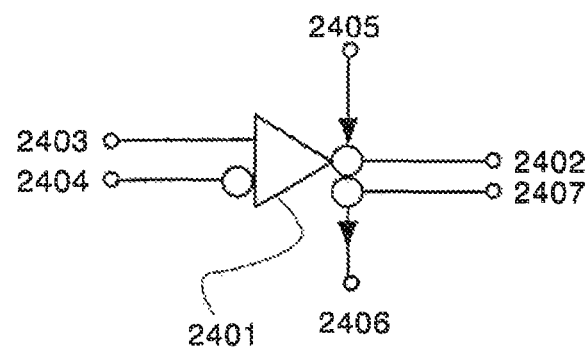
FIG. 24 is a diagram showing a symbol expressing a clocked inverter circuit to which the invention is applied.

FIG. 24 shows a symbol 2401 representing the circuit in FIG. 23. When an H signal is input to a terminal 2405, a signal from an input terminal 2403 is inverted and output to an output terminal 2402. An inverted signal of the signal at the input terminal 2403 is input to an input terminal 2404, an inverted signal of the signal at the input terminal 2405 is input to an input terminal 2406 and an inverted signal of the signal at the output terminal 2402 is output to an output terminal 2407. Therefore, the terminal 1603C corresponds to the terminal 2405, the terminal 1604C corresponds to the terminal 2406 and the terminal 1604A corresponds to a terminal 2403. In addition, the terminal 1603A corresponds to the terminal 2404, the terminal 2306 corresponds to the terminal 2402 and a terminal 2306E corresponds to the terminal 2407.

Figure 25:
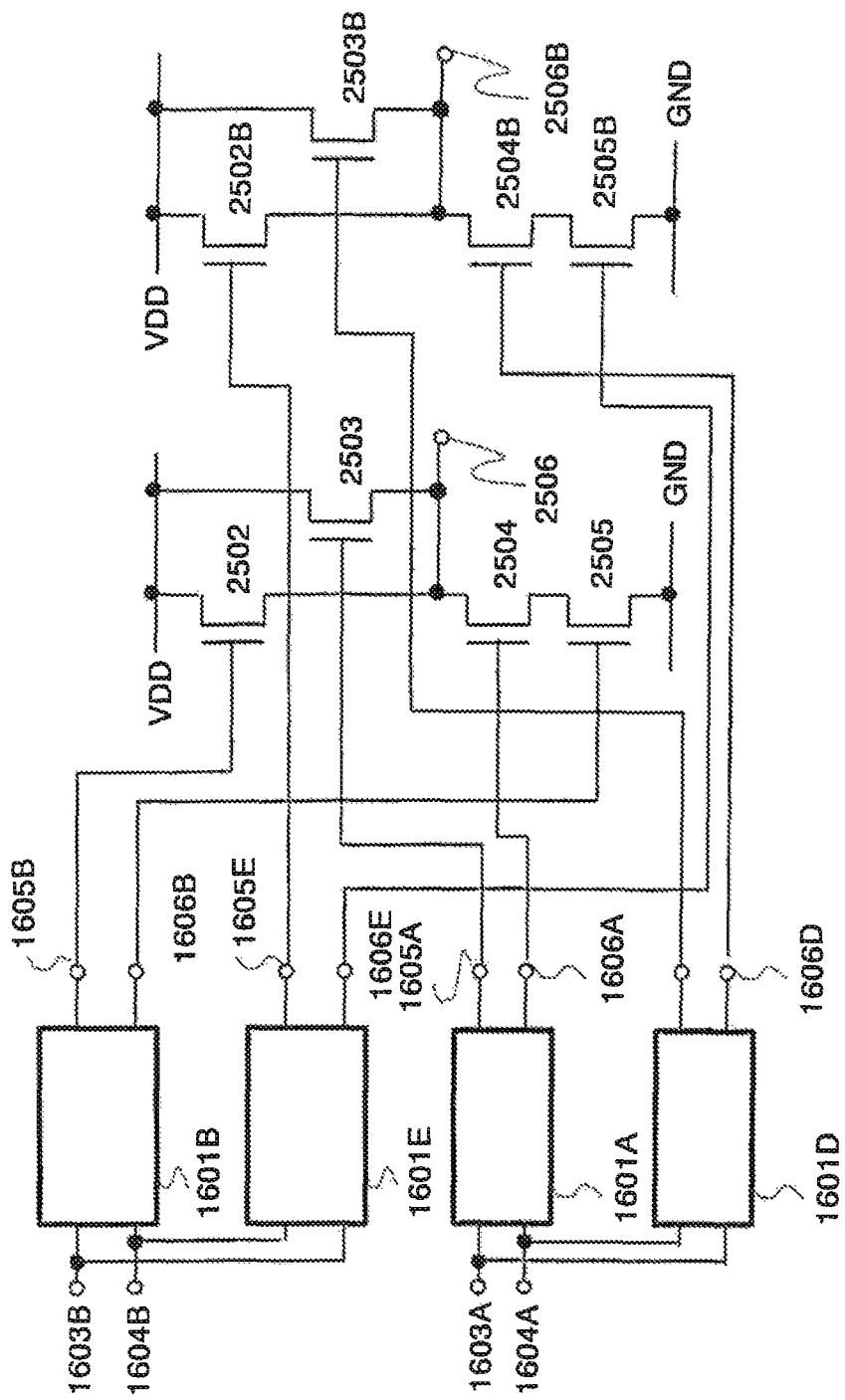
FIG. 25 is a diagram showing the configuration of a circuit in the case of applying the invention to a NAND circuit.

Similarly, FIG. 25 shows the configuration of a NAND circuit to which the invention is applied. One NAND circuit includes transistors 2502, 2503, 2504 and 2505 while another NAND circuit includes transistors 2502B, 2503B, 2504B and 2505B. When each of the NAND circuits is input with a pair of signals inverted from each other, a pair of signals inverted from each other can be output. However, each of the gate terminals of the transistors 2502, 2503, 2502B and 2503B is required to be input with a potential which is higher than VDD. Further, each of the gate terminals of the transistors 2502 and 2502B or each of the gate terminals of the transistors 2503 and 2503B is required to be input with a pair of signals inverted from each other. Thus, the four level correction circuits 1601A, 1601B, 1601D and 1601E are required.

Figure 26:
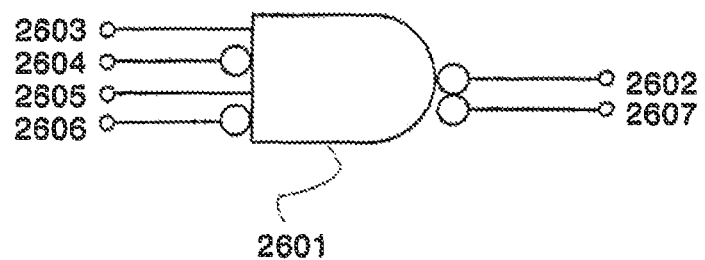
FIG. 26 is a diagram showing a symbol expressing a NAND circuit to which the invention is applied.

FIG. 26 shows a symbol 2601 representing the circuit in FIG. 25. Signals from input terminals 2603 and 2605 are output to an output terminal 2602. An inverted signal of the signal at the input terminal 2603 is input to an input terminal 2604, an inverted signal of the signal at the input terminal 2605 is input to an input terminal 2606 and an inverted signal of the signal at the output terminal 2602 is input to an output terminal 2607. The terminal 1604B corresponds to the terminal 2603, the terminal 1604A corresponds to the terminal 2605 and the terminal 1603B corresponds to the terminal 2604. In addition, the terminal 1603A corresponds to the terminal 2606, the terminal 2506 corresponds to the terminal 2602 and a terminal 2506B corresponds to the terminal 2607.

Similarly, the invention can be applied to a NOR circuit.

It is to be noted that although a level correction circuit is employed in this embodiment mode to control the potential level, the invention is not limited to this. The circuit may be operated by directly inputting a signal having a large amplitude. For example, the terminal 1605C in FIGS. 17 and 23 may be input with a signal having a large amplitude without using the level correction circuit 1601C, specifically, such as a signal whose potential at H level is higher than VDD. Similarly, a signal having a large amplitude may be directly input to the terminals 1605A, 1606A, 1605B and 1606B in FIGS. 17 and 23 without using the level correction circuits 1601A and 1601B.

Figure 27:
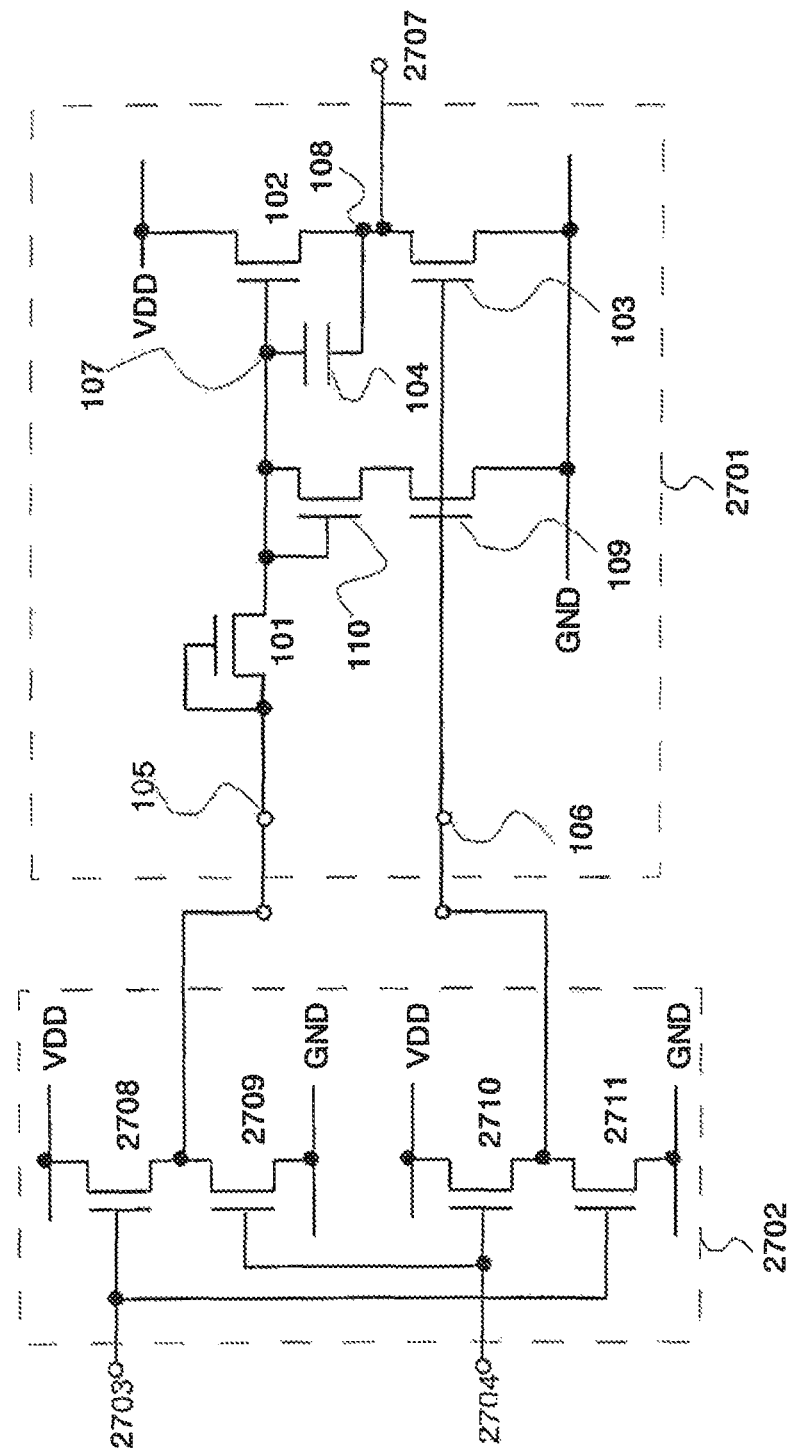
FIG. 27 is a diagram showing the configuration of a circuit in the case of applying the invention to an inverter circuit.

It is also to be noted that although a signal is input to a circuit to be operated after controlling a potential level by using a level correction circuit in this embodiment mode, the invention is not limited to this. Conversely, it is also possible to operate a circuit first, and then control its potential level. FIG. 27 shows the configuration of an inverter circuit to which the invention is applied. Two pairs of inverter circuits are configured by using transistors 2708, 2709, 2710 and 2711. This is because an inverted signal is also required in a level correction circuit 2701 in the subsequent stage. Signals are input from an input terminal 2703 and an input terminal 2704 for inputting the inverted signal, and output to an output terminal 2707 after the levels are controlled in the level correction circuit 2701. The invention can be applied to alternative circuits as well as an inverter.

As described above, the invention can be applied to various circuits such as a clocked inverter circuit and a NAND circuit described in the present embodiment mode; however, the invention is not limited to them. It can be applied to various alternative circuits.

The things using the circuits explained in Embodiment Modes 1 to 4 are described in this embodiment mode. Therefore, the description in Embodiment Modes 1 to 4 can be also applied to this embodiment mode, and with the circuit configurations, a semiconductor device with accurate operation can be manufactured at low cost.

Embodiment 1

Described in this embodiment is the configuration and operation of a display device, a signal line driver circuit and the like. The circuit configurations described in Embodiment Modes 1 to 5 can be applied to a part of a signal line driver circuit or a part of a gate line driver circuit.

Figure 28:
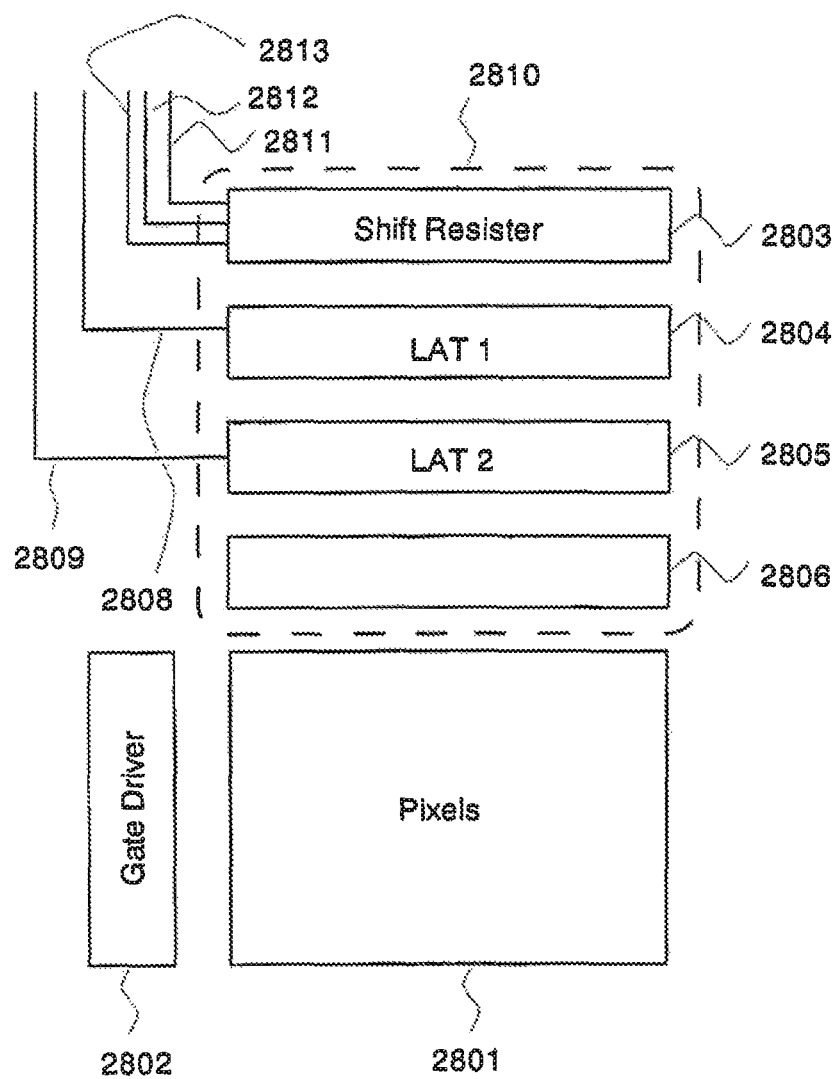
FIG. 28 is a diagram showing the configuration of a display device of the invention.

Referring to FIG. 28, a display device includes pixels 2801, a gate line driver circuit 2802 and a signal line driver circuit 2810. The gate line driver circuit 2802 sequentially outputs selection signals to the pixels 2801 and the signal line driver circuit 2810 sequentially outputs video signals to the pixels 2801. In the pixels 2801, an image is displayed by controlling the state of light according to the video signals. Voltage is frequently employed as a video signal input from the signal line driver circuit 2810 to the pixels 2801. That is, the states of a display element disposed in the pixel and an element for controlling the display element are changed according to a video signal (voltage) input from the signal line driver circuit 2810 in many cases. Occasionally, current is input to the pixels 2801 as a video signal. As examples of the display element disposed in each pixel, liquid crystal (LCD), organic EL, an element for an FED (field emission display), a DMD (digital mirror device) or the like can be employed.

It is to be noted that the number of the gate line driver circuit 2802 and the signal line driver circuit 2810 may be more than one.

The configuration of the signal line driver circuit 2810 may be divided into a plurality of units. For example, it is roughly divided into a shift register 2803, a first latch circuit (LAT1) 2804, a second latch circuit (LAT 2) 2805, a digital-to-analog converter circuit 2806 and the like.

The operation of the signal line driver circuit 2810 is described in brief now. The shift register 2803 includes a plurality of lines of flip flop circuits (FF), latch circuits and the like, and a clock signal (S-CLK) 2812, a start pulse (SP) 2813 and a clock inverted signal (S-CLKb) 2811 are input thereto. According to the timing of these signals, sampling pulses are sequentially output.

A sampling pulse output from the shift register 2803 is input to the first latch circuit 2804. The first latch circuit 2804 is input with a video signal from a video signal line 2808, and according to the timing at which the sampling pulse is input, the video signal is held in the first latch circuit 2804 in each line. In the case of disposing the digital-to-analog converter circuit 2806, the video signals are digital values.

When the video signal storage is completed up to the last line in the first latch circuit 2804, a latch pulse (Latch Pulse) is input from a latch control line 2809 during a horizontal fry-back period, and the video signals held in the first latch circuit 2804 are transferred to the second latch circuit 2805 all at once. Then, one row of the video signals held in the second latch circuit 2805 are input to the digital-to-analog converter circuit 2806 all at one. Signals output from the digital-to-analog converter circuit 2806 are then input to the pixels 2801.

While the video signals held in the second latch circuit 2805 are input to the pixels 2801 through various circuits, the shift register 2803 outputs sampling pulses again. That is, two operations are performed at the same time. Therefore, a line sequential drive is enabled. In this manner, such operations are repeated.

It is to be noted that when the first latch circuit 2804 and the second latch circuit 2805 are capable of storing an analog value, the digital-to-analog converter circuit 2806 can be omitted in many cases. Meanwhile, when the data output to the pixels 2801 has a binary value, namely a digital value, the digital-to-analog converter circuit 2806 can be omitted in many cases. The signal line driver circuit 2810 incorporates a level shift circuit, a gamma-correction circuit, a voltage-to-current converter circuit, an amplifier circuit and the like in some cases.

In addition, it is possible to omit the first latch circuit 2804 and the second latch circuit 2805, and connect the video signal line 2808 to the pixels 2801 through a transfer gate circuit (analog switch circuit). In that case, the transfer gate circuit is controlled by a sampling pulse output from the shift register 2803.

As described above, the configuration of the signal line driver circuit 2810 is not limited to the one shown in FIG. 28, and various configurations can be employed.

On the other hand, since the gate line driver circuit 2802 just outputs selection signals to the pixels 2801 sequentially in many cases, it may include a shift register, a level shifter circuit, an amplifier circuit and the like having the similar configuration as that of the shift register 2803 in the signal line driver circuit 2810. However, the configuration of the gate line driver circuit 2802 is not limited to this and various configurations can be employed.

The circuit configurations shown in Embodiment Modes 1 to 5 can be applied to various circuit parts such as the shift register of the signal line driver circuit 2810 and the gate line driver circuit 2802, or the first latch circuit (LAT1) 2804 and the second latch circuit 2805 of the signal line driver circuit 2810.

Figure 29:
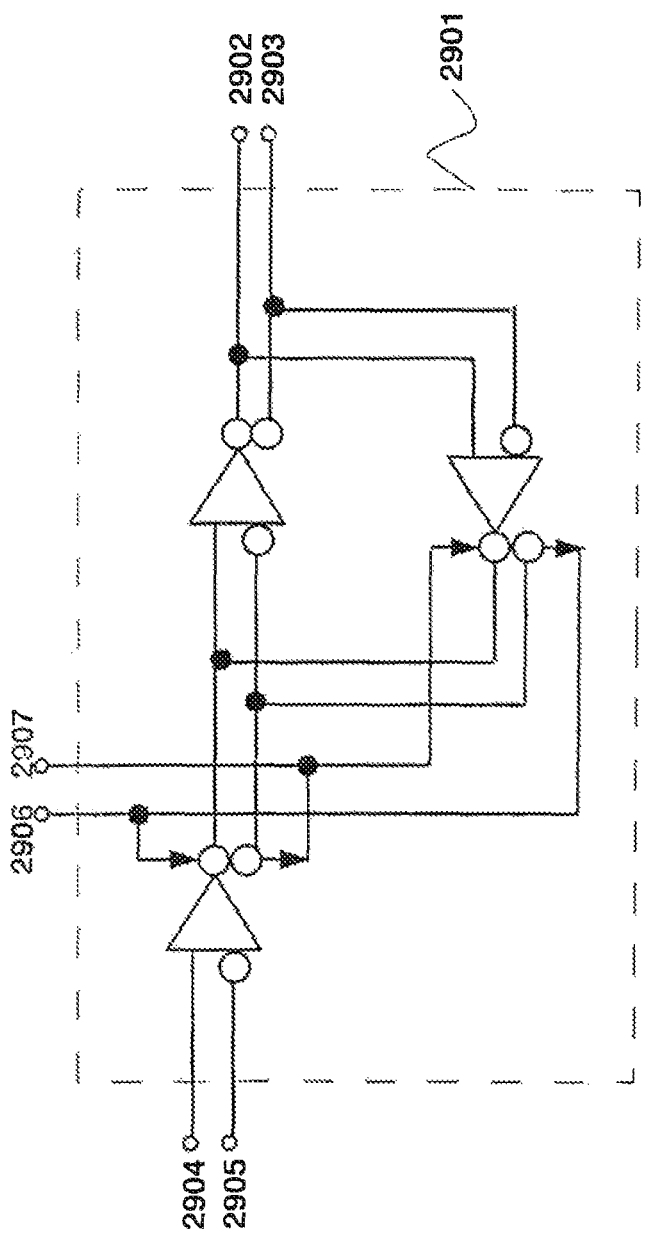
FIG. 29 is a diagram showing the configuration of a circuit in the case of applying the invention to a DFF circuit.
Figure 30:
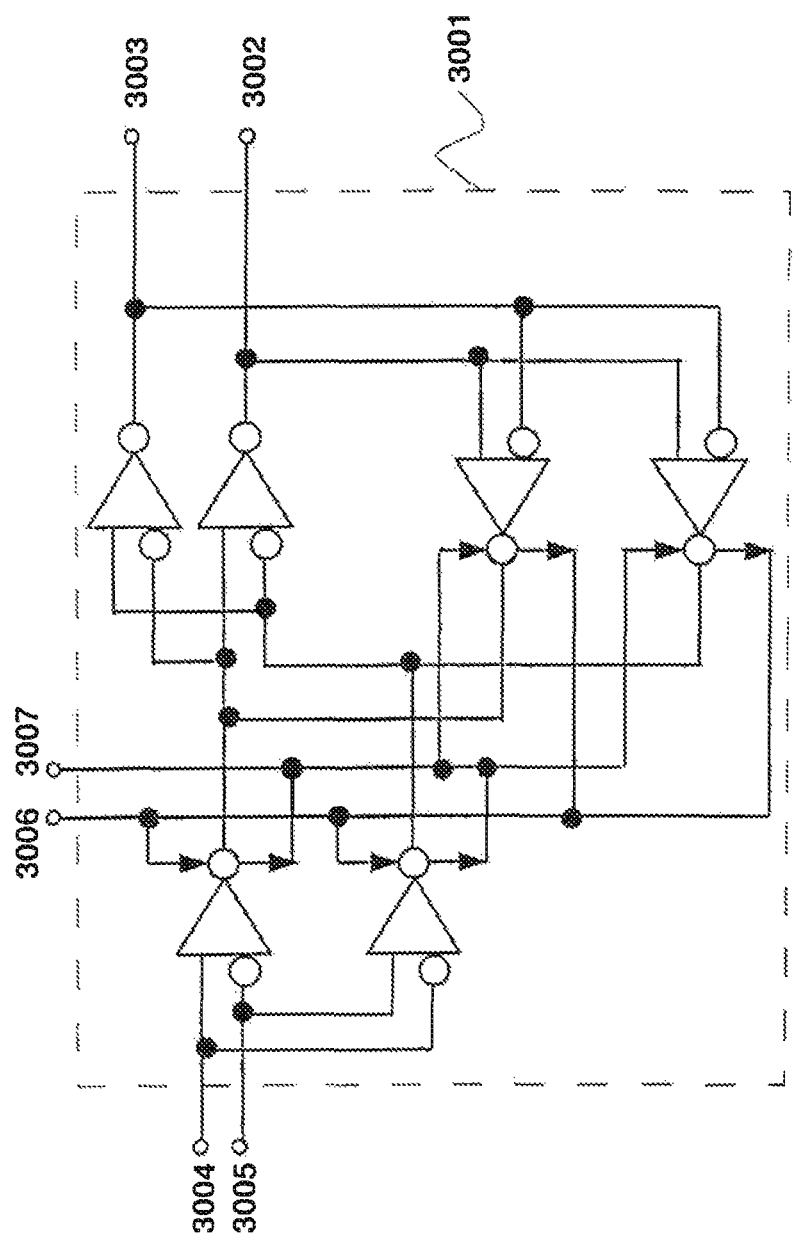
FIG. 30 is a diagram showing the configuration of a circuit in the case of applying the invention to a DFF circuit.

Referring now to FIGS. 29 and 30, a DFF circuit (delay flip flop circuit) used in the shift register, the first latch circuit (LAT1) 2804 and the second latch circuit 2805 is described.

In a DFF circuit 2901 shown in FIG. 29, a signal is input to an input terminal 2904 and the circuit operation is controlled according to a synchronizing signal input to terminals 2906 and 2907. Then, the signal is output to an output terminal 2902. Each of terminals 2904 and 2905 is input with a pair of signals inverted from each other, and similarly, each of the terminals 2906 and 2907 is input with a pair of signals inverted from each other. As for an output, each of terminals 2902 and 2903 outputs a pair of signals inverted from each other. Similarly, in a DFF circuit 3001 shown in FIG. 30, signals are transmitted between terminals 300 to 3007.

In FIG. 29, a circuit for outputting an inverted signal is disposed. On the other hand, in FIG. 30, a circuit for outputting no inverted signal is disposed. Therefore, each circuit part is disposed in parallel to each other for generating an inverted signal.

Figure 31:
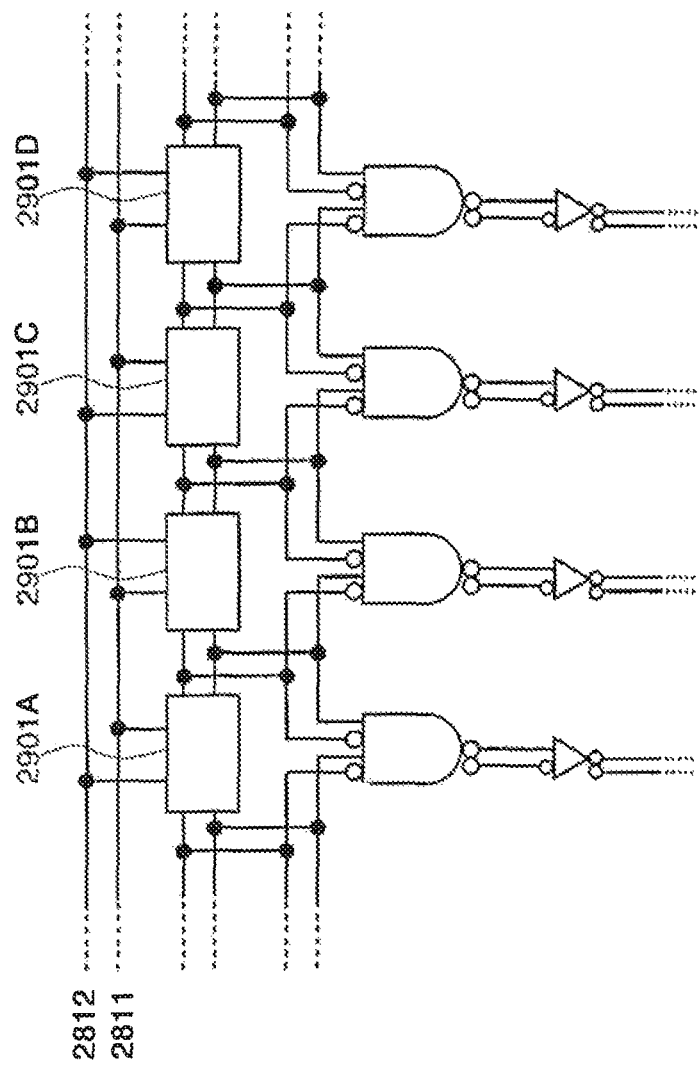
FIG. 31 is a diagram showing the configuration of a circuit in the case of applying the invention to a shift register.

FIG. 31 shows a part of a shift register which is configured with DFF circuits and the like. It includes DFF circuits 2901A to 2901D. The circuit shown in FIG. 29 or in FIG. 30 may be used as each DFF circuit. A clock signal (S-CLK) 2812 and a clock inverted signal (S-CLKb) are input to the parts corresponding to the terminals 2906 and 2907 (or the terminals 3006 and 3007), and, in synchronism with these signals, the shift register is operated.

When configuring the first latch circuit (LAT1) 2804 by using DFF circuits and the like, a sampling pulse which is output from the shift register is input to the parts corresponding to the terminals 2906 and 2907 (or the terminals 3006 and 3007). In addition, when configuring the second latch circuit (LAT2) 2805 by using DFF circuits and the like, a latch pulse (Latch Pulse) is input to the parts corresponding to the terminals 2906 and 2907 (or the terminals 3006 and 3007) from the latch control line 2809.

In the case of employing the circuit shown in FIG. 17 or FIG. 23 as a clocked inverter circuit in the DFF circuit of the shift register, and setting the signal amplitude of the clock signal (S-CLK) 2812 and the clock inverted signal (S-CLKb) larger than that of the power supply voltage, the level correction circuit 1601C in FIG. 17, FIG. 23 and the like can be omitted.

Similarly, in the case of employing the circuit shown in FIG. 17 or FIG. 23 as a clocked inverter circuit in the DFF circuit of the first latch circuit (LAT1) 2804 or the second latch circuit (LAT2) 2805, and setting the signal amplitude of the video signal input from the video signal line 2808 and the latch pulse (Latch Pulse) input from the latch control line 2809 larger than that of the power supply voltage, some of the level correction circuits in FIG. 17, FIG. 23 and the like can be omitted.

It is to be noted that any types of transistor can be used for the transistor in the invention and it may be formed on any types of substrate. Accordingly, it is possible to form the whole circuit shown in FIG. 28 on a glass substrate, a plastic substrate, a single crystal substrate, an SOI substrate or the like. Alternatively, a part of the circuit shown in FIG. 28 may be formed on a certain substrate and another part of the circuit shown in FIG. 28 may be formed on another substrate. That is, not all part of the circuit shown in FIG. 28 is necessarily formed on the same substrate. For example, in FIG. 28, it is possible that the pixels 2801 and the gate line driver circuit 2802 are formed with TFTs on a glass substrate and the signal line driver circuit 2810 (or part of it) is formed on a single crystal substrate, thereby connecting the IC chip onto the glass substrate by COG (Chip On Glass). In place of COG, TAB (Tape Auto Bonding), a printed substrate and the like may be used as well.

As described above, a semiconductor device having the circuit configurations described in Embodiment Modes 1 to 5 can be applied to a display device.

Embodiment 2

Electronic devices, using the semiconductor device of the invention, include a video camera, a digital camera, a goggle type display (head mounted display), a navigation system, a sound reproducing device (a car audio equipment, an audio component stereo and the like), a laptop personal computer, a game machine, a portable information terminal (a mobile computer, a cellular phone, a portable game machine, an electronic book and the like), an image reproducing device including a recording medium (more specifically, an apparatus which can reproduce a recording medium such as a digital versatile disc (DVD) and so forth, and includes a display for displaying the reproduced image) or the like. Specific examples of these electronic devices are shown in FIG. 32.

Figure 32A:
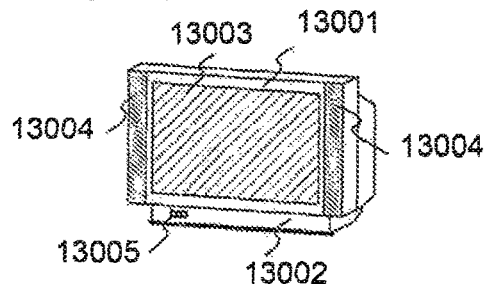
FIGS. 32A to 32H are diagrams showing electronic devices to which the invention is applied.

FIG. 32A shows a light emitting device, which includes a housing 13001, a support base 13002, a display portion 13003, a speaker portion 13004, a video input terminal 13005 and the like. The display device using the semiconductor device of the invention can be applied to the display portion 13003. According to the invention, the light emitting device as shown in FIG. 32A is completed. Since a light emitting device emits light by itself, it requires no back light and thus a thinner display portion than a liquid crystal display is obtained. Note that, the light emitting device includes all the information display devices for personal computers, television broadcast reception, advertisement displays and the like.

Figure 32B:
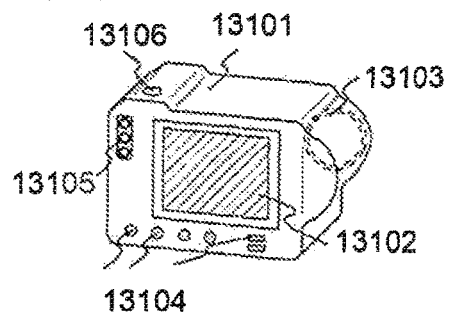

FIG. 32B shows a digital still camera, which includes a main body 13101, a display portion 13102, an image receiving portion 13103, operating keys 13104, an external connection port 13105, a shutter 13106 and the like. The display device using the semiconductor device of the invention can be applied to the display portion 13102. According to the invention, the digital still camera as shown in FIG. 32B is completed.

Figure 32C:
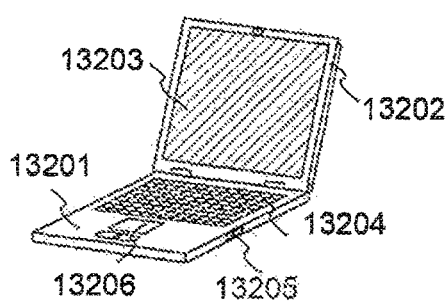

FIG. 32C shows a laptop personal computer, which includes a main body 13201, a housing 13202, a display portion 13203, a keyboard 13204, an external connection port 13205, a pointing mouse 13206 and the like. The display device using the semiconductor device of the invention can be applied to the display portion 13203. According to the invention, the light emitting device a shown in FIG. 32C is completed.

Figure 32D:
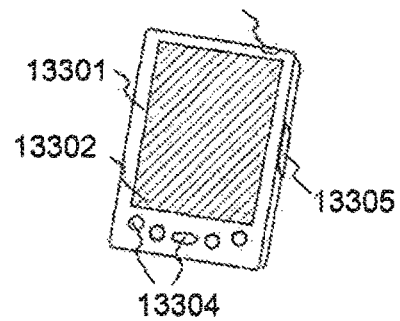

FIG. 32D shows a mobile computer, which includes a main body 13301, a display portion 13302, a switch 13303, operating keys 13304, an infrared port 13305 and the like. The display device using the semiconductor device of the invention can be applied to the display portion 13302. According to the invention, the mobile computer as shown in FIG. 32D is completed.

Figure 32E:
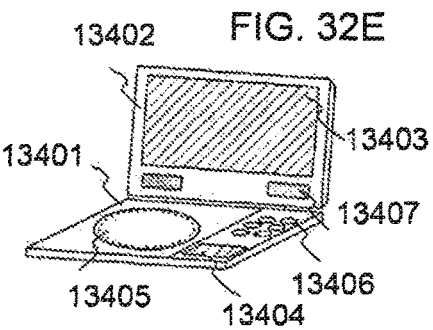

FIG. 32E shows a portable image reproducing device provided with a recording medium (specifically, a DVD playback device), which includes a main body 13401, a housing 13402, a display portion A13403, a display portion B13404, a recording medium (such as a DVD) read-in portion 13405, operating keys 13406, a speaker portion 13407 and the like. The display portion A13403 mainly displays image data and the display portion B13404 mainly displays text data. The display device using the semiconductor device of the invention can be applied to the display portions A13403 and B13404. Note that the image reproducing device provided with a recording medium includes a game machine for domestic use and the like. According to the invention, the DVD playback device shown in FIG. 32E is completed.

Figure 32F:
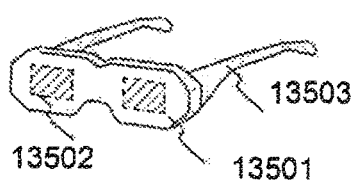

FIG. 32F shows a goggle type display (head mounted display), which includes a main body 13501, a display portion 13502, and an arm portion 13503. The semiconductor device of the invention can be applied to the display portion 13502. According to the invention, the goggle type display as shown in FIG. 32F is completed.

Figure 32G:
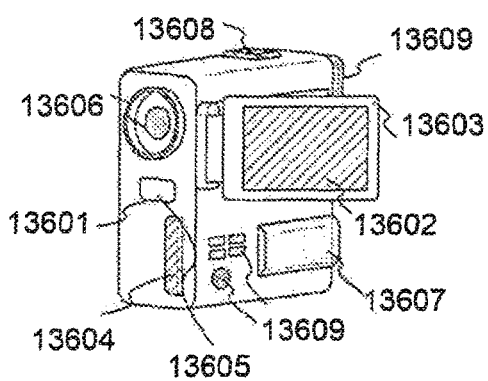

FIG. 32G shows a video camera, which includes a main body 13601, a display portion 13602, a housing 13603, an external connection port 13604, a remote control receiving portion 13605, an image receiving portion 13606, a battery 13607, an audio input portion 13608, operating keys 13609 and the like. The display device using the semiconductor device of the invention can be applied to the display portion 13602. According to the invention, the video camera as shown in FIG. 32G is completed.

Figure 32H:
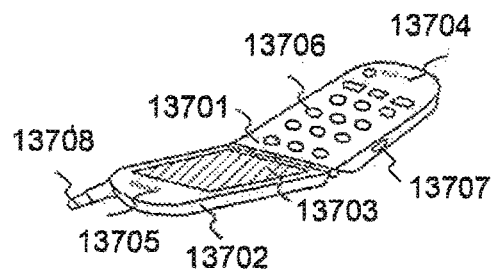

FIG. 32H shows a cellular phone, which includes a main body 13701, a housing 13702, a display portion 13703, an audio input portion 13704, an audio output portion 13705, an operating keys 13706, an external connection port 13707, an antenna 13708 and the like. The display device using the semiconductor device of the invention can be applied to the display portion 13703. Note that, by displaying white characters on a black background of the display portion 13703, the consumption current of the cellular phone can be suppressed. According to the invention, the cellular phone as shown in FIG. 32H is completed.

If the higher luminance of a light emitting material becomes available in the future, the semiconductor device of the invention will be applicable to a front type or a rear type projector in which light including output image data is enlarged by lenses or the like.

The above-described electronic devices are more likely to be used for displaying data that is transmitted through telecommunication paths such as Internet or a CATV (cable television), in particular for displaying moving image data. Since a light emitting material exhibits high response speed, a light emitting device is suitably used for a moving image display.

In addition, since a light emitting device consumes power in its light emitting portion, it is desirable that data is displayed so that the light emitting portion occupies as small space as possible. Therefore, in the case of using a light emitting device in a display portion that mainly displays text data such as a cellular phone and a sound reproducing device, it is desirable to drive the device so that text data is displayed with light emitting parts on a non-emitting background.

As described above, an application range of the invention is so wide that the invention can be applied to electronic devices in various fields. The electronic devices in this embodiment may include a display device using a semiconductor device having any one of configurations shown in the foregoing Embodiment Modes 1 to 5.

The invention claimed is:

1. A semiconductor device comprising:
a first transistor;
a second transistor;
a third transistor; and
a fourth transistor,
wherein the first transistor, the second transistor, the third transistor, and the fourth transistor are each an N-channel transistor, and
wherein:
one of a source and a drain of the first transistor is electrically connected to one of a source and a drain of the second transistor;
one of a source and a drain of the third transistor is electrically connected to one of a source and a drain of the fourth transistor;
the one of the source and the drain of the third transistor is electrically connected to a gate of the first transistor;
the other of the source and the drain of the first transistor is electrically connected to the other of the source and the drain of the third transistor;
the other of the source and the drain of the first transistor is electrically connected to a gate of the third transistor;
the other of the source and the drain of the second transistor is electrically connected to a first wiring;
the other of the source and the drain of the fourth transistor is electrically connected to the first wiring;
a gate of the second transistor is electrically connected to a gate of the fourth transistor;
the other of the source and the drain of the first transistor is electrically connected to a first input terminal;
the gate of the second transistor is electrically connected to a second input terminal; and
the one of the source and the drain of the first transistor is electrically connected to an output terminal.

2. The semiconductor device according to claim 1, wherein the other of the source and the drain of the first transistor is configured to be input with a first signal, wherein the gate of the second transistor is configured to be input with a second signal; and
wherein the one of the source and the drain of the first transistor is configured to output a third signal.

3. The semiconductor device according to claim 1, wherein the first wiring is configured to be supplied with a first potential.

4. A semiconductor device comprising:
a first transistor;
a second transistor;
a third transistor; and
a fourth transistor,
wherein:
one of a source and a drain of the first transistor is electrically connected to one of a source and a drain of the second transistor;
one of a source and a drain of the third transistor is electrically connected to one of a source and a drain of the fourth transistor;
the one of the source and the drain of the third transistor is electrically connected to a gate of the first transistor;
the other of the source and the drain of the first transistor is electrically connected to the other of the source and the drain of the third transistor;
the other of the source and the drain of the first transistor is electrically connected to a gate of the third transistor;
the other of the source and the drain of the second transistor is electrically connected to the other of the source and the drain of the fourth transistor;
the other of the source and the drain of the first transistor is configured to be input with a first signal; and
a gate of the second transistor is configured to be input with a second signal.

5. The semiconductor device according to claim 4, wherein the first transistor, the second transistor, the third transistor, and the fourth transistor have the same polarity.

6. The semiconductor device according to claim 4, wherein the first transistor, the second transistor, the third transistor, and the fourth transistor are each an N-channel transistor.

7. The semiconductor device according to claim 4, comprising a gate line driver circuit comprising the first transistor, the second transistor, the third transistor, and the fourth transistor.

8. A display device comprising:
a pixel over a substrate; and
a gate line driver circuit over the substrate and configured to output a selection signal to the pixel,
wherein the gate line driver circuit comprises a first transistor, a second transistor, a third transistor and a fourth transistor, and
wherein:
one of a source and a drain of the first transistor is electrically connected to one of a source and a drain of the second transistor;
one of a source and a drain of the third transistor is electrically connected to one of a source and a drain of the fourth transistor;
the one of the source and the drain of the third transistor is electrically connected to a gate of the first transistor;
the other of the source and the drain of the first transistor is electrically connected to the other of the source and the drain of the third transistor;
the other of the source and the drain of the first transistor is electrically connected to a gate of the third transistor;
the other of the source and the drain of the second transistor is electrically connected to the other of the source and the drain of the fourth transistor;
the other of the source and the drain of the first transistor is configured to be input with a first signal; and
a gate of the second transistor is configured to be input with a second signal.

9. The display device according to claim 8, wherein the first transistor, the second transistor, the third transistor, and the fourth transistor have the same polarity.

10. The display device according to claim 8, wherein the first transistor, the second transistor, the third transistor, and the fourth transistor are each an N-channel transistor.

* * * * *